(12) United States Patent
Kang et al.

(10) Patent No.: US 11,055,164 B2
(45) Date of Patent: Jul. 6, 2021

(54) ERROR CORRECTION DECODER AND MEMORY CONTROLLER HAVING THE SAME

(71) Applicant: SK hynix Inc., Icheon-si (KR)

(72) Inventors: Soon Young Kang, Yongin-si (KR); Dae Sung Kim, Icheon-si (KR); Wan Je Sung, Seongnam-si (KR); Myung Jin Jo, Seongnam-si (KR); Jae Young Han, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/676,320

(22) Filed: Nov. 6, 2019

(65) Prior Publication Data

US 2020/0341829 A1    Oct. 29, 2020

(30) Foreign Application Priority Data

Apr. 23, 2019   (KR) .................. 10-2019-0047439

(51) Int. Cl.
| | |
|---|---|
| G06F 11/00 | (2006.01) |
| G06F 11/07 | (2006.01) |
| G06F 11/10 | (2006.01) |
| H03M 13/11 | (2006.01) |
| H03M 13/39 | (2006.01) |
| G06F 13/16 | (2006.01) |

(52) U.S. Cl.
CPC ........ *G06F 11/076* (2013.01); *G06F 11/1044* (2013.01); *G06F 13/1668* (2013.01); *H03M 13/1108* (2013.01); *H03M 13/3927* (2013.01)

(58) Field of Classification Search
CPC ............ G06F 11/1044; G06F 13/1668; G06F 11/1076; H03M 13/1108; H03M 13/3927
USPC .................. 714/780, 755, 758, 774, 704
See application file for complete search history.

(56) References Cited

U.S. PATENT DOCUMENTS

| | | | |
|---|---|---|---|
| 2005/0138520 A1* | 6/2005 | Richardson | H04L 1/0051 714/755 |
| 2012/0005560 A1* | 1/2012 | Steiner | H03M 13/2927 714/780 |
| 2019/0149168 A1* | 5/2019 | Chang | H03M 13/1108 714/752 |

FOREIGN PATENT DOCUMENTS

| | | |
|---|---|---|
| KR | 10-2011-0044939 | 5/2011 |
| KR | 10-2020-0033688 A | 3/2020 |

\* cited by examiner

*Primary Examiner* — Christine T. Tu
(74) *Attorney, Agent, or Firm* — Perkins Coie LLP

(57) ABSTRACT

There are provided an error correction decoder and a memory system having the same. The error correction decoder includes a node processor for performing at least one iteration of an error correction decoding based on at least one parameter used for an iterative decoding, a reliability information generator for generating reliability information corresponding to a current iteration upon a determination that the error correction decoding corresponding to the current iteration has been unsuccessful, and a parameter adjuster for adjusting the at least one parameter upon a determination that the reliability information satisfies a predetermined condition, and controlling the node processor to perform a next iteration based on the adjusted.

19 Claims, 18 Drawing Sheets

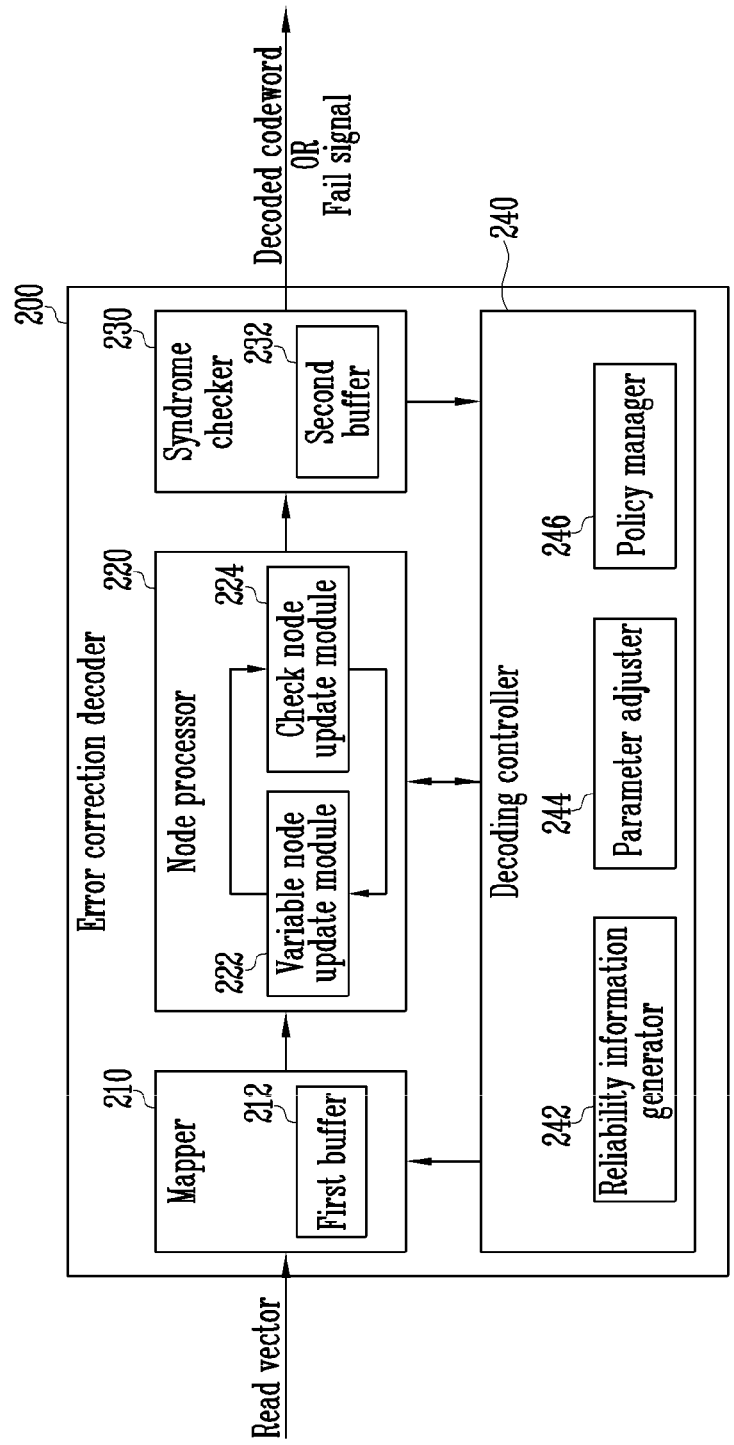

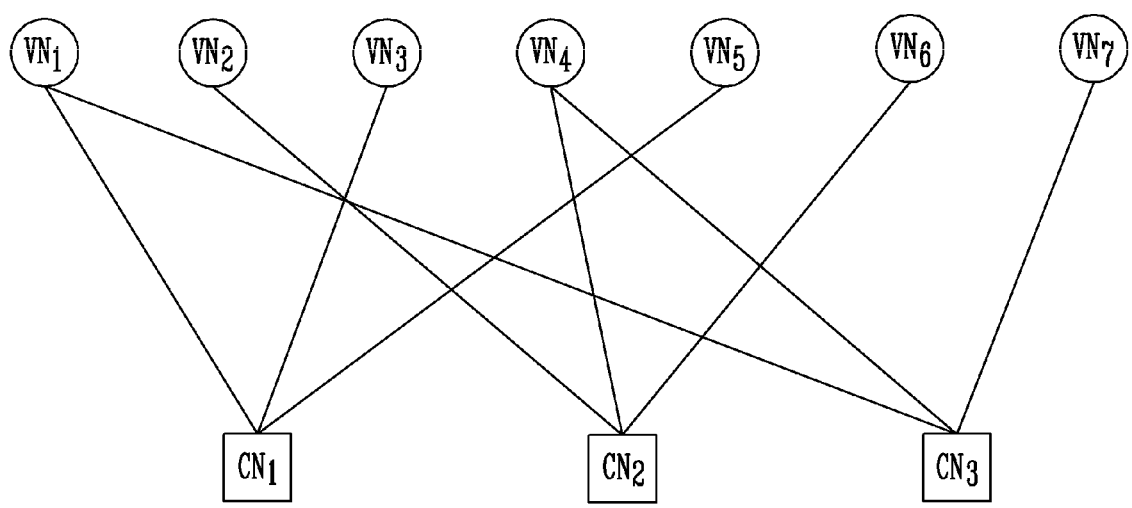

FIG. 5
$$\begin{bmatrix} 1 & 0 & 1 & 0 & 1 & 0 & 0 \\ 0 & 1 & 0 & 1 & 0 & 1 & 0 \\ 1 & 0 & 0 & 1 & 0 & 0 & 1 \end{bmatrix} \times \begin{bmatrix} C_{i1} \\ C_{i2} \\ C_{i3} \\ \vdots \\ C_{i7} \end{bmatrix} = \begin{bmatrix} S_{i1} \\ S_{i2} \\ S_{i3} \end{bmatrix}$$
$H$          $C_i^T$          $S_i$
FIG. 6
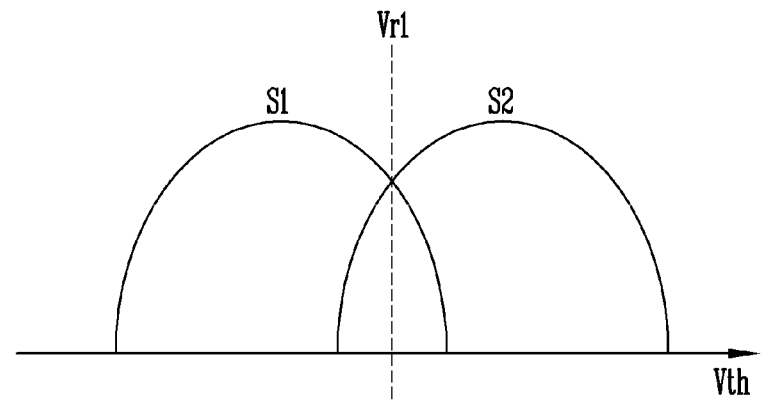
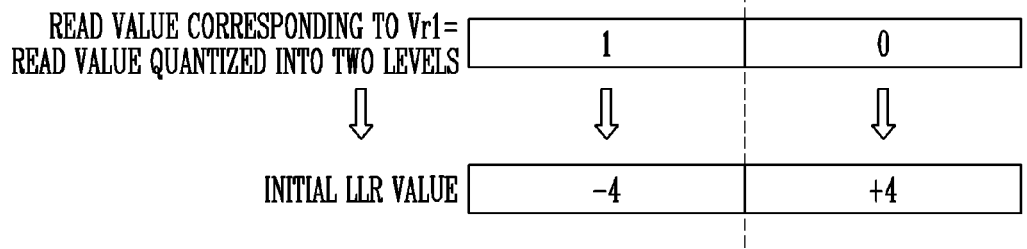

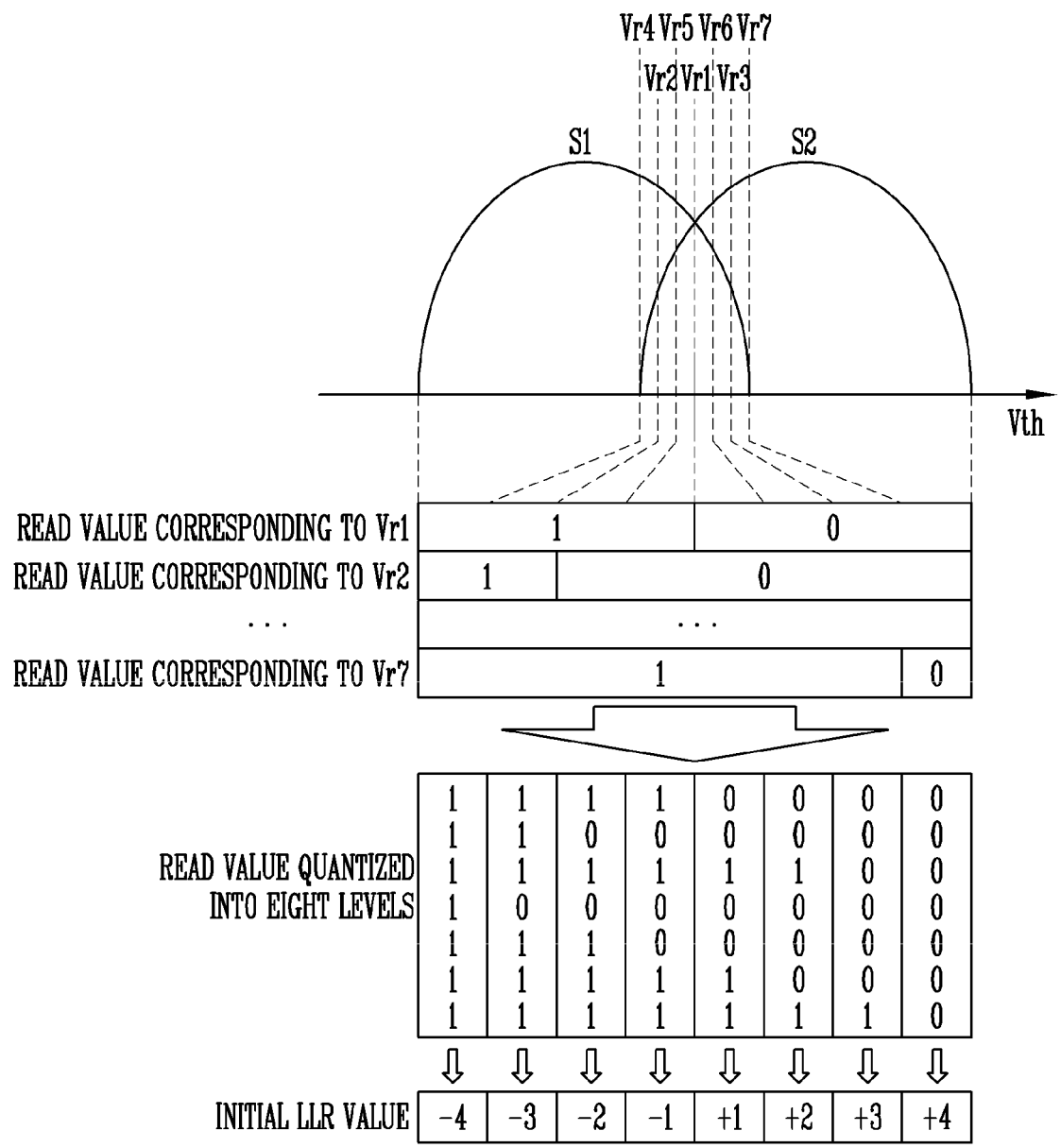

FIG. 8

| QUANTIZATION LEVEL | LLR1 | LLR2 | LLR3 | LLR4 | LLR5 | LLR6 | LLR7 | LLR8 |
|---|---|---|---|---|---|---|---|---|
| 2 | -4 | +4 | | | | | | |
| 3 | -4 | -2 | +4 | | | | | |
| 4 | -4 | -2 | +2 | +4 | | | | |
| 5 | -4 | -3 | -2 | +2 | +4 | | | |
| 6 | -4 | -3 | -2 | -1 | +2 | +4 | | |
| 7 | -4 | -3 | -2 | -1 | +1 | +2 | +4 | |
| 8 | -4 | -3 | -2 | -1 | +1 | +2 | +3 | +4 |

FIG. 9

< RELIABILITY DETERMINATION POLICY >

| FIRST CONDITION | CASE WHERE RATIO OF NUMBER OF SCNs IS LESS THAN FIRST THRESHOLD VALUE |
|---|---|
| SECOND CONDITION | CASE WHERE RATIO OF NUMBER OF VARIABLE NODES OF WHICH APP IS EQUAL TO OR GREATER THAN FIRST SET VALUE IS LESS THAN SECOND THRESHOLD VALUE |
| THIRD CONDITION | CASE WHERE RATIO OF NUMBER OF CHECK NODES OF WHICH MIN VALUE IS EQUAL TO OR GREATER THAN SECOND SET VALUE IS LESS THAN THIRD THRESHOLD VALUE |

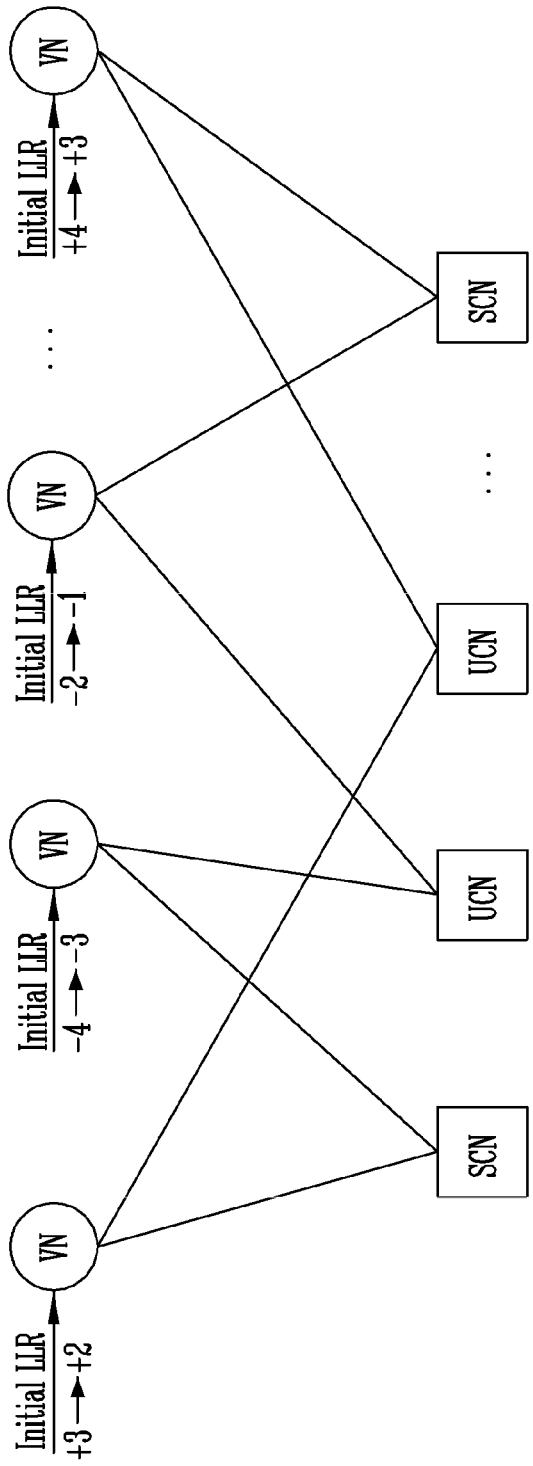

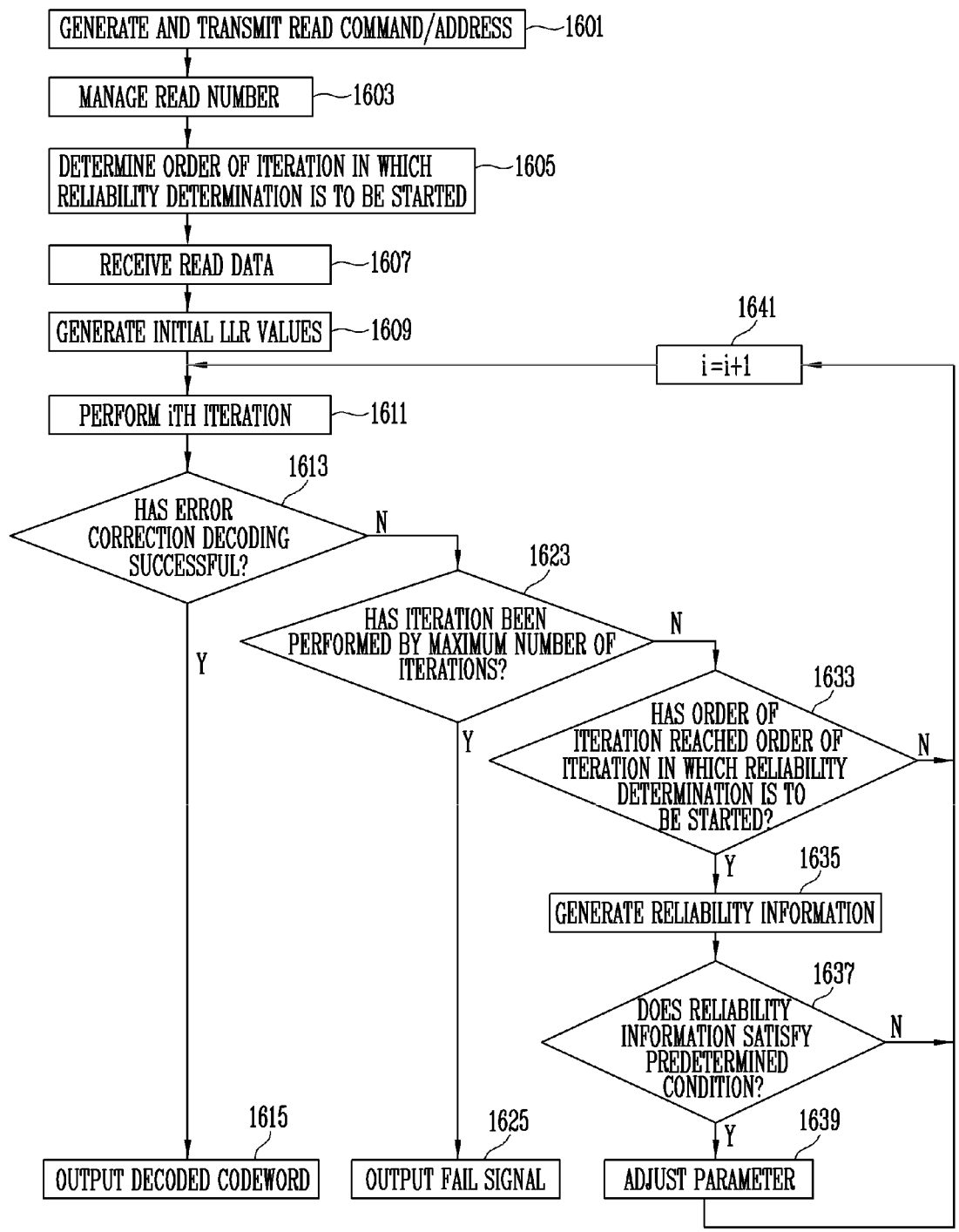

FIG. 17

< RELIABILITY DETERMINATION POLICY >

| FIRST CONDITION | CASE WHERE RATIO OF NUMBER OF SCNs IS LESS THAN FIRST THRESHOLD VALUE |
|---|---|
| SECOND CONDITION | CASE WHERE RATIO OF NUMBER OF VARIABLE NODES OF WHICH APP IS EQUAL TO OR GREATER THAN FIRST SET VALUE IS LESS THAN SECOND THRESHOLD VALUE |
| THIRD CONDITION | CASE WHERE RATIO OF NUMBER OF CHECK NODES OF WHICH MIN VALUE IS EQUAL TO OR GREATER THAN SECOND SET VALUE IS LESS THAN THIRD THRESHOLD VALUE |
| FOURTH CONDITION | CASE WHERE RATIO OF NUMBER OF VARIABLE NODES OF WHICH HD VALUE IS '1' IS LESS THAN FOURTH THRESHOLD VALUE |

ERROR CORRECTION DECODER AND MEMORY CONTROLLER HAVING THE SAME

CROSS-REFERENCE TO RELATED APPLICATION

This patent document claims priority to and benefits of the Korean patent application number 10-2019-0047439, filed on Apr. 23, 2019, which is incorporated herein by reference in its entirety for all purposes.

TECHNICAL FIELD

Various embodiments of the disclosed technology generally relate to an error correction decoder and a memory controller having the same.

BACKGROUND

A memory system may include a storage medium that temporarily or permanently stores data. A data error or data corruption may occur during various operations such as writing, reading, transmission, or processing.

In order to ensure the reliability of data, the memory system may use error correction techniques such as error correction encoding and error correction decoding.

SUMMARY

Embodiments of the disclosed technology relate to an error correction decoder and a memory controller having the error correction decoder. Some implementations of the disclosed technology can reduce or avoid error floor phenomenon caused by a failure in error correction decoding.

An embodiment of the disclosed technology may provide for an error correction decoder. The error correction decoder may include a node processor configured to perform at least one iteration of an error correction decoding, based on at least one parameter used for an iterative decoding; a reliability information generator configured to generate reliability information corresponding to a current iteration upon a determination that the error correction decoding corresponding to the current iteration has been unsuccessful; and a parameter adjuster configured to adjust the at least one parameter upon a determination that the reliability information satisfies a predetermined condition, and control the node processor to perform a next iteration based on the adjusted parameter.

An embodiment of the disclosed technology may provide for a memory system. The memory system may include a memory device; and a memory controller in communication with the memory device and configured to receive at least one read vector from a first storage area of the memory device, and perform an error correction decoding, based on the received read vector, wherein the memory controller includes a node processor configured to perform at least one iteration of the error correction decoding based on at least one parameter used for an iterative decoding; a reliability information generator configured to generate reliability information corresponding to a current iteration upon a determination that the error correction decoding corresponding to the current iteration has been unsuccessful; and a parameter adjuster configured to adjust the at least one parameter upon a determination that the reliability information satisfies a predetermined condition, and control the node processor to perform a next iteration based on the adjusted parameter.

BRIEF DESCRIPTION OF THE DRAWINGS

FIG. 2 is an example diagram illustrating an error correction decoder shown in FIG. 1.

FIG. 3 is an example of a parity check matrix.

FIG. 4 is an example of a Tanner graph for a parity check matrix shown in FIG. 3.

FIG. 5 is an example diagram illustrating a syndrome vector calculated using the parity check matrix shown in FIG. 3.

FIG. 6 is an example diagram illustrating a process of generating an initial log likelihood ratio (LLR) value by using one read value in hard decision decoding.

FIG. 7 is an example diagram illustrating a process of generating an initial LLR value by using g read values in soft decision decoding.

FIG. 8 is an example of a lookup table.

FIG. 9 is an example table illustrating a reliability determination policy based on some implementations of the disclosed technology.

FIG. 10 is an example diagram illustrating a process of adjusting a parameter based on some implementations of the disclosed technology.

FIG. 16 is an example flowchart illustrating an operating method of the memory controller based on some implementations of the disclosed technology.

FIG. 17 is an example table of a reliability determination policy based on some implementations of the disclosed technology.

DETAILED DESCRIPTION

The specific structural or functional descriptions disclosed herein are merely illustrative for the purpose of describing embodiments and the disclosed technology can be implemented in various forms without being limited to the embodiments set forth herein.

Figure 1:
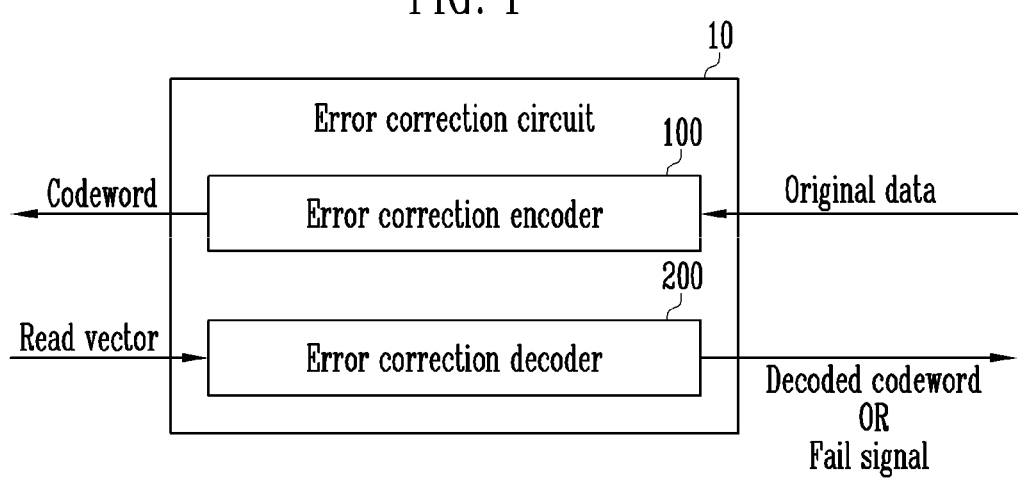
FIG. 1 is an example diagram illustrating an error correction circuit based on some implementations of the disclosed technology.

FIG. 1 is an example diagram illustrating an error correction circuit based on some implementations of the disclosed technology.

Referring to FIG. 1, the error correction circuit 10 may include an error correction encoder 100 and an error correction decoder 200.

The error correction encoder 100 may receive original data that is to be encoded, and may perform an error correction encoding by using the received original data and a generator matrix of an error correction code (ECC). In some embodiments, the error correction encoder 100 may perform the error correction encoding by using the original data and a parity check matrix of the ECC.

The error correction encoder 100 may output, to a channel, a codeword generated as a result of performing the error correction encoding. For example, when the error correction circuit 10 is applied to a memory system, the codeword may be stored in a plurality of memory cells (e.g., memory cells constituting one page) included in a memory device. In some implementations, the error correction encoder 100 may use a low density parity check (LDPC) code as the ECC. In some implementations, the error correction encoder 100 may use other techniques than the LDPC.

The error correction decoder 200 may receive a read vector from the channel, and perform the error correction decoding by using the received read vector and a parity check matrix of an ECC.

The error correction decoder 200 may perform the error correction decoding by using various algorithms which implement an iterative decoding scheme. For example, the error correction decoder 200 may perform the error correction decoding by using a message passing algorithm (MPA) designated as a belief propagation algorithm (BPA). For example, the error correction decoder 200 may perform the error correction decoding by using a sum-product algorithm, a min-sum algorithm, or a scaled min-sum algorithm, but the disclosed technology are not limited thereto.

The error correction decoder 200 may perform the error correction decoding by performing at least one iteration without exceeding a maximum number of iterations (I) specified in the iterative decoding scheme. Here, the maximum number of iterations (I) may be a natural number. When a valid codeword satisfying constraints of the parity check matrix of the ECC within the maximum number of iterations (I) is generated, the error correction decoder 200 may output the generated valid codeword as a decoded codeword. When the valid codeword satisfying the constraints of the parity check matrix of the ECC within the maximum number of iterations (I) is not generated, the error correction decoder 200 may output a fail signal representing that the error correction decoding has failed. The error correction decoder 200 may use an LDPC code as the ECC, but other error correcting codes than LDPC code can be used.

FIG. 2 is an example diagram illustrating the error correction decoder shown in FIG. 1.

Referring to FIG. 2, the error correction decoder 200 may include a mapper 210, a node processor, a syndrome checker 230, and a decoding controller 240.

The mapper 210 may receive a read vector from the channel. Each of read values included in the read vector may be '0' or '1.' When hard decision decoding is used, one read vector may correspond to one codeword. When soft decision decoding is used, a plurality of read vectors may correspond to one codeword.

The mapper 210 may generate a read vector quantized into g+1 levels by using g read vectors corresponding to one codeword. Here, g is a natural number. Each of read values included in the read vector quantized into 'g+1' levels may be a read value quantized into 'g+1' levels. The read value quantized into 'g+1' levels may be a read pattern (e.g., a bit sequence) configured with g bits. For example, a read value quantized into two levels may be '1' or '0.' For example, one of read values quantized into two levels may be '1,' and the other of the read values quantized into two levels may be '0.' For example, a read value quantized into three levels may be '11,' '10,' '01' or '00.' For example, three read values quantized into three levels may be three among '11,' '00,' '10' or '01.'

When the hard decision decoding is used (i.e., when 'g' is 1), the mapper 210 may determine that one read vector itself is a read vector quantized into two levels.

When the soft decision decoding is used (i.e., when 'g' is 2 or more), the mapper 210 may generate a read vector quantized into 'g+1' levels by coupling 'g' read vectors. The mapper 210 may include a first buffer 212. When quantized level 'g+1' is used, the first buffer 212 may receive and store 'g' read vectors. The mapper 210 may generate a read vector quantized into 'g+1' levels by coupling the g read vectors stored in the first buffer 212.

The mapper 210 may convert a read vector quantized into 'g+1' levels into an initial log likelihood ratio (LLR) vector. The initial LLR vector may include a plurality of initial LLR values. That is, the mapper 210 may convert each of read values quantized into 'g+1' levels into an initial LLR value.

The mapper 210 may provide an initial LLR vector to the node processor 220. The providing of the initial LLR vector may be performed for each initialization and each iteration.

The node processor 220 may perform the error correction decoding by using the MPA, based on the initial LLR vector received from the mapper 210. According to the MPA, a result of converging on a codeword may be generated through an exchange of messages between variable nodes and check nodes. The message may include a variable to check (V2C) message transmitted from the variable node to the check node and a check to variable (C2V) message transmitted from the check node to the variable node.

The node processor 220 may perform at least one iteration within the maximum number of iterations (I). The node processor 220 may perform the iteration by using various scheduling schemes.

When a flooding scheme is used, each iteration may include a process of transmitting V2C messages from the variable nodes to the check nodes, a process of updating values of the check nodes, a process of transmitting C2V messages from the check nodes to the variable nodes, and a process of updating values of the variable nodes.

When a column-layered scheme is used, a first iteration may include a process of transmitting V2C messages from the variable nodes to the check nodes and a process of updating values of the check nodes. When the column-layered scheme is used, each iteration except the first iteration may include a process of transmitting C2V messages from the check nodes to the variable nodes, a process of updating values of the variable nodes, a process of transmitting V2C messages from the variable nodes to the check nodes, and a process of updating values of the check nodes.

Hereinafter, for convenience of description, an example in which the error correction decoding is performed according to the flooding scheme will be described, but embodiments of the disclosed technology are not limited thereto. The embodiments of the disclosed technology may be applied to the column-layered scheme and a row-layered scheme.

The node processor 220 may include a variable node update module 222 and a check node update module 224.

In an initialization step, the variable node update module 222 may initialize the variable nodes by using the initial LLR vector received from the mapper 210. Thus, the variable node update module 222 may allocate initial LLR values included in the initial LLR vector to the respective variable nodes.

In a first iteration, the variable node update module 222 may generate V2C messages such that an initial LLR value of each of the variable nodes can be transferred to a check node connected to the corresponding variable node, and transmit the generated V2C messages to the node update module 224.

In each iteration except the first iteration, the variable node update module 222 may generate V2C messages based on C2V messages received from the check node update module 224 and transmit the generated V2C messages to the check node update module 224. In some embodiments, the variable node update module 222 may be generate V2C messages by further considering the initial LLR vector received from the mapper 210. For example, when the scaled min-sum algorithm is used, the variable node update module 222 may generate V2C messages corresponding to an ith iteration according to Equation 1.

$$Q_{mn} = Y_{n\_ch} + \sum_{m' \in N(n) \setminus m} R_{nm'} \quad \text{[Equation 1]}$$

The size of a parity check matrix is M×N, n∈{1, ..., N}, and m∈{1, ..., M}, M and N being natural numbers. In addition, $Q_{mn}$ represents a V2C message transmitted from variable node n to check node m, $Y_{n\_ch}$ represents an initial LLR value corresponding to the variable node n, N(n)\m represents a set of the other check nodes except the check node m among check nodes connected to the variable node n, and $R_{nm'}$ represents a C2V message transmitted from check node m' to the variable node n.

In each iteration, the variable node update module 222 may update values of the variable nodes, based on C2V messages received from the check node update module 224. In some embodiments, the variable node update module 222 may update values of the variable nodes by further considering the initial LLR vector received from the mapper 210. The updating of values of the variable nodes may include calculating APPs (A Posteriori Probabilities) of the variable nodes and determining hard decision values of the variable nodes based on the calculated APPs. For example, when the scaled min-sum algorithm is used, the variable node update module 222 may calculate APPs of variable nodes corresponding to the ith iteration.

$$L_n = Y_{n\_ch} + \sum_{m \in N(n)} R_{nm} \quad \text{[Equation 2]}$$

Here, $L_n$ represents an APP of the variable node n, N(n) represents a set of check nodes connected to the variable node n, and $R_{nm}$ represents a C2V message transmitted from the check node m to the variable node n.

When the APP $L_n$ is a negative value, the hard decision value of the variable node n may be determined as '1.' When the APP $L_n$ is not a negative value, the hard decision value of the variable node n may be determined as '0.'

In each iteration, the check node update module 224 may update values of the check nodes, based on the V2C messages received from the variable node update module 222. When the min-sum algorithm or the scaled min-sum algorithm is used, the values of the check nodes may include min1 and min1_idx. Here, min1 means a smallest magnitude among magnitudes represented by V2C messages received from variable nodes connected to a check node, and min1_idx means an index of a variable node that transmits a V2C message representing the smallest magnitude. In some embodiments, the values of the check nodes may further include min2 and min2_idx. Here, min2 means a second smallest magnitude among the magnitudes represented by V2C messages received from the variable nodes connected to the check node, and min2_idx means an index of a variable node that transmits a V2C message representing the second smallest magnitude.

Hereinafter, a minimum value or min value may mean min1.

In each iteration, the check node update module 224 may generate C2V messages, based on the V2C messages received from the variable node update module 222, and transmit the generated C2V messages to the variable node update module 222. For example, when the scaled min-sum algorithm is used, the check node update module 224 may generate C2V messages corresponding to the ith iteration according to Equation 3.

$$R_{nm} = \alpha \times \left( \prod_{n' \in N(m) \setminus n} \text{sign}(Q_{mn'}) \right) \times \max(\min_{n' \in N(m) \setminus n}(|Q_{mn'}|) - \beta, 0) \quad \text{[Equation 3]}$$

Here, α represents a scaling factor, $R_{nm}$ represents a C2V message transmitted from the check node m to the variable n, N(m)\n represents a set of the other nodes except the variable node n among variable nodes connected to the check node m, $Q_{mn'}$ represents a V2C message transmitted from variable node n' to the check node m, and β represents a scaling offset.

The node processor 220 may provide the syndrome checker 230 with hard decision values (hereinafter, referred to a hard decision vector $C_i$) of variable nodes represented as a result obtained by performing the ith iteration. Here, i is a natural number not greater than I. The hard decision vector ($C_i$) may be a row vector or column vector. In the following descriptions, an example case where the hard decision vector ($C_i$) is a row vector is assumed.

In an embodiment, the node processor 220 may calculate a number of variable nodes of which an APP corresponding the ith iteration is equal to or greater than a first set value, and provide information on the calculated number to the decoding controller 240.

In an embodiment, the node processor 220 may calculate a number of check nodes of which minimum value corresponding to the ith iteration is equal to or greater than a second set value, and provide information on the calculated number to the decoding controller 240.

When a valid codeword satisfying constraints of the parity check matrix of the ECC within the maximum number of iterations (I) is generated, the syndrome checker 230 may output the generated valid codeword as a decoded codeword. For example, the syndrome checker 230 may store the hard decision vector ($C_i$) corresponding to the ith iteration, which is received from the node processor 220, in a second buffer 232 and perform a syndrome check on the received hard decision vector ($C_i$). In an example, the syndrome check may be performed by checking whether all entries of a syndrome vector ($S_i$) calculated by Equation 4 are '0.'

$$S_i = H \cdot C_i^T \quad \text{[Equation 4]}$$

Here, $S_i$ represents a syndrome vector corresponding to the ith iteration, H represents a parity check matrix of the ECC, and $C_i^T$ represents a transpose of a hard decision vector ($C_i$) corresponding to the ith iteration.

When all the entries of the syndrome vector ($S_i$) are '0,' this means that the syndrome check has passed. This means that the error correction decoding in the ith iteration has been successfully performed. Therefore, the syndrome checker 230 may output the hard decision vector $C_i$ stored in the second buffer 232 as a decoded codeword.

When an entry that is not '0' among the entries of the syndrome vector $S_i$ exists, this means that the syndrome check has failed. This means that the error correction decoding in the ith iteration has failed. Therefore, when the ith iteration is within the maximum number of iterations I, the node processor 220 may perform an (i+1)th iteration. A check node corresponding to the entry that is not '0' among the entries of the syndrome vector $S_i$ may be referred to as an unsatisfied check node (UCN), and a check node corresponding to the entry that is '0' among the entries of the syndrome vector $S_i$ may be referred to as a satisfied check node (SCN).

In an embodiment, when the syndrome check in the ith iteration fails, the syndrome checker 230 may provide the decoding controller 240 with information on a number of SCNs corresponding to the ith iteration.

The decoding controller 240 may control at least one of the mapper 210 or the node processor 220 such that a valid codeword can be generated within the maximum number of iterations (I). The decoding controller 240 may include a reliability information generator 242, a parameter adjuster 244, and a policy manager 246.

The reliability information generator 242 may generate reliability information corresponding to the ith iteration, when the syndrome check corresponding to the ith iteration fails.

The reliability information may include information associated with, for example, at least one of a number of SCNs, APPs of variable nodes, or minimum values of check nodes.

In an embodiment, the reliability information may include information on a ratio of a number of SCNs corresponding to the ith iteration to a total number of check nodes. For example, the reliability information generator 242 may receive information on a number of SCNs corresponding to the ith iteration from the syndrome checker 230, and calculate a ratio of a number of SCNs corresponding to the ith iteration to the total number of check nodes, based on the received information.

In an embodiment, the reliability information may include information on a ratio of a number of variable nodes of which an APP corresponding to the ith iteration is equal to or greater than the first set value to a total number of variable nodes. For example, the reliability information generator 242 may receive information on a number of variable nodes of which an APP corresponding to the ith iteration is equal to or greater than the first set value from the node processor 220, and calculate a ratio of a number of variable nodes of which an APP is equal to or greater than the first set value to the total number of variable nodes, based on the received information. The first set value may be experimentally determined or be determined according to a quantization level. For example, the first set value may be set to be greater for a higher quantization level.

In an embodiment, the reliability information may include information on a ratio of a number of check nodes of which minimum value corresponding to the ith iteration is equal to or greater than the second set value to the total number of check nodes. For example, the reliability information generator 242 may receive information on a number of check nodes of which minimum value corresponding to the ith iteration is equal to or greater than the second set value from the node processor 220, and calculate a ratio of a number of check nodes of which minimum value is equal to or greater than the second set value to the total number of check nodes, based on the received information. The second set value may be experimentally determined or be determined according to a quantization level. For example, the second set value may be set to be greater for a higher quantization level.

The reliability information generator 242 may provide the parameter adjuster 244 with reliability information corresponding to the ith iteration.

The parameter adjuster 244 may adjust at least one of parameters used for the iterative decoding scheme based on whether reliability information corresponding to the ith iteration, which is received from the reliability information generator 242, satisfies a predetermined condition, and control the node processor 220 such that the (i+1)th iteration can be performed using the adjusted parameter.

The parameter adjuster 244 may adjust at least one of a plurality of parameters, when the reliability information satisfies any one of predetermined conditions or satisfies a plurality of conditions. For example, when the reliability information includes information on a number of SCNs and information on APPs of variable nodes, the parameter adjuster 244 may adjust one or more parameters when only one or all of the information is satisfied.

The parameter may include, for example, at least one of an initial LLR vector, a scaling factor, or a scaling offset, etc. In some implementations, the parameters may include other characteristic without being limited thereto.

In an embodiment, the parameter adjuster 244 may adjust an initial LLR vector stored in the first buffer 212. For example, the parameter adjuster 244 may decrease or increase, by a set value, a magnitude of each of initial LLR values included in the initial LLR vector stored in the first buffer 212. Accordingly, in the (i+1)th iteration, the variable node update module 222 can generate V2C messages by using the adjusted initial LLR values, and update values of the variable nodes.

In an embodiment, the parameter adjuster 244 may adjust a scaling factor used for the scaled min-sum algorithm, and control the node processor 220 such that the (i+1)th iteration can be performed using the adjusted scaling factor.

In an embodiment, the parameter adjuster 244 may adjust a scaling offset used for the scaled min-sum algorithm, and control the node processor 220 such that the (i+1)th iteration can be performed using the adjusted scaling offset.

The policy manager 246 may store a reliability determination policy used to determine whether a parameter is to be adjusted. The reliability determination policy may define at least one condition for adjusting a parameter. For example, the reliability determination policy may define a condition associated with at least one of a number of SCNs, APPs of variable nodes, or minimum values of check nodes.

FIG. 3 is an example diagram illustrating a parity check matrix.

An (N, K) code may be defined using a parity check matrix having a size of M×N. Here, K represents a length of original data, M represents a number of parities, and M=N−K. Each entry of the parity check matrix may be '0' or '1.' When a number of '1' is relatively smaller than a number of '0,' the (N, K) code may be referred to as an (N, K) LDPC code. Here, N and K may be natural numbers. FIG. 3 illustrates an example of the parity check matrix of a (7, 4) code.

A matrix having each entry configured as a sub-matrix can be referred to as a base matrix. Each entry of the base matrix may be a sub-matrix having a size of z×z. Here, z may be an integer greater than or equal to 2. For example, in a base matrix of a binary LDPC code, '0' may represent that a corresponding entry is a zero matrix (of size z×z), and '1' may represent that the corresponding entry is not the zero matrix. For example, in a base material of a quasi cyclic (QC)-LDPC code, '1' may represent that a corresponding entry is a cyclic permutation matrix. The cyclic permutation matrix is a matrix obtained by performing a cyclic shift by a predetermined shift value on an identify matrix. In an example, any one cyclic permutation matrix may have a shift value different from that of another cyclic permutation matrix in the base matrix.

FIG. 4 is a diagram illustrating an example of a Tanner graph for the parity check matrix shown in FIG. 3.

The (N, K) code may be expressed as a Tanner graph expressed using an equivalent bipartite graph, and is represented by (N−k) check nodes, N variable nodes, and edges. The check nodes correspond to rows of the parity check matrix, and variable nodes correspond to columns of the parity check matrix. Each edge is coupled to one check node and one variable node, and indicates a '1' entry in the parity check matrix.

The parity check matrix of the (7, 4) code shown in FIG. 3 may be represented by the Tanner graph that includes three check nodes $CN_1$ to $CN_3$ and seven variable nodes $VN_1$ to $VN_7$ as shown in FIG. 4. Solid lines coupled to the check nodes $CN_1$ to $CN_3$ and the variable nodes $VN_1$ to $VN_7$ indicate edges.

Iterative decoding may be performed, based on a message passing algorithm between the check nodes $CN_1$ to $CN_3$ and the variable nodes $VN_1$ to $VN_7$ in the Tanner graph.

FIG. 5 is an example diagram illustrating a syndrome vector calculated using the parity check matrix shown in FIG. 3.

As described above, a syndrome vector $S_i$ may be generated as a product of a parity check matrix H and a transpose vector ($C_i^T$) of a hard decision vector ($C_i$) corresponding to an ith iteration. Entries $Ci1, C_{i2}, C_{i3}, \ldots, C_{i7}$ of the hard decision vector $C_i$ represent hard decision values of variable nodes corresponding to the ith iteration. Entries $S_{i1}, S_{i2}$, and $S_{i3}$ of the syndrome vector ($S_i$) respectively correspond to the check nodes ($CN_1, CN_2$, and $CN_3$) in the Tanner graph shown in FIG. 4.

When all the entries $S_{i1}, S_{i2}$, and $S_{i3}$ of the syndrome vector $S_i$ are '0,' this means that a syndrome check has passed. This means that error correction decoding has been successfully performed in a current iteration. Therefore, the iterative decoding can be ended, and the hard decision vector $C_i$ corresponding to the ith iteration is output as a decoded codeword.

When at least one entry among all the entries $S_{i1}, S_{i2}$, and $S_{i3}$ of the syndrome vector ($S_i$) is not '0,' this means that the syndrome check has failed. This means that the error correction decoding has not succeeded in the current iteration. Therefore, if the ith iteration hat not exceeded the maximum number of iterations (I), a subsequent iteration is performed.

FIG. 6 is an example diagram illustrating a process of generating an initial LLR value by using one read value in hard decision decoding.

In FIG. 6, the distribution of a threshold voltage (Vth) in memory cells each having any one of a first state (S1) and a second state (S2) is illustrated.

In order to acquire one read vector corresponding to one codeword, one read voltage may be applied to a plurality of memory cells.

For example, when a first read voltage (Vr1) is applied to a plurality of memory cells, a read value of a memory cell having a threshold voltage lower than the first read voltage (Vr1) may be '1,' and a read value of a memory cell having a threshold voltage higher than the first read voltage (Vr1) may be a '0.' For example, when one read voltage, e.g., the first read voltage (Vr1), is applied to the memory cells, one read value may be acquired per each memory cell.

The error correction decoder may determine a first read value corresponding to the first read voltage (Vr1) as a read value quantized into two levels.

The error correction decoder may convert the read value quantized into two levels into an initial LLR value. The conversion into the initial LLR value may be performed based on a lookup table. The lookup table may be predetermined.

FIG. 7 is an example diagram illustrating a process of generating an initial LLR value by using 'g' read values in soft decision decoding.

In FIG. 7, the distribution of a threshold voltage Vth of memory cells each having any one of a first state $S_i$ and a second state S2 is illustrated.

When a 3-level quantization is used, 'g' read voltages may be sequentially applied to a plurality of memory cells so as to acquire 'g' read vectors corresponding to one codeword.

For example, when a 3-level quantization is used, one read voltage, for example, Vr1, may be applied the plurality of memory cells. When a 3-level quantization is used, two read voltages, for example, Vr1 and Vr2, may be sequentially applied to the plurality of memory cells. Similarly, when a 8-level quantization is used, seven read voltages, for example, Vr1, Vr2, Vr3, Vr4, Vr5, Vr6, and Vr7, may be sequentially applied the plurality of memory cells. This means that, when the 'g+1' level quantization is used, 'g' read values may be acquired per each memory cell, When any one read voltage among the 'g' read voltages is applied to the plurality of memory cells, a read value of a memory cell having a threshold voltage lower than the applied read voltage may be '1,' and a read value of a memory cell having a threshold voltage higher than the applied read voltage may be '0.'

The error correction decoder may generate a read value quantized into 'g+1' levels by coupling read values corresponding to the g read voltages. For example, as shown in FIG. 7, when the seven read voltages Vr1, Vr2, Vr3, Vr4, Vr5, Vr6, and Vr7 are used, the error correction decoder may generate a read value quantized into eight levels corresponding to the seven read voltages.

The error correction decoder may convert the read value quantized into the 'g+1' levels into an initial LLR value. The conversion into the initial LLR value may be performed with reference to a predetermined lookup table.

FIG. 8 is an example of a lookup table.

Referring to FIG. 8, the lookup table may define LLR values corresponding to each of a plurality of quantization levels.

The error correction circuit 10 may convert each of read values quantized into 'g+1' levels into any one of 'g+1' LLR values corresponding to the 'g+1' quantization levels, based on the lookup table.

For example, when a 2-level quantization is used, the error correction decoder may convert one of read values into LLR1 and convert the other of the read values into LLR2. For example, '1' may be converted into LLR1 whose value is '−4', and '0' may be converted into LLR2 whose value is '+4.'

FIG. 8 shows an example of the read value(s) depending on the quantization level. Thus, the read value and/or read values may mean the corresponding value(s) that are quantized into 'g+1' levels. Similarly, the read vector also can refer to the read vector quantized 'g+1' levels.

FIG. 9 is an example table illustrating a reliability determination policy based on some implementations of the disclosed technology.

Many conventional ECCs exhibit an error floor phenomenon. The error floor phenomenon is observed when a curve on a graph representing a signal to noise ratio (SNR) and a bit error rate (BER) is suddenly flattened. The error floor phenomenon is caused by a failure of an error correction decoding at a specific error level but can be mitigated by properly adjusting a parameter used for the error correction decoding.

The reliability determination policy in accordance with the embodiment of the present disclosure may define conditions used to adjust parameters such that the error floor phenomenon can be mitigated.

For example, the reliability determination policy may define a condition associated with at least one of a number of SCNs, APPs of variable nodes, or minimum values of check nodes. In an example, three conditions are illustrated in FIG. 9, but embodiments of the disclosed technology are not limited thereto.

A first condition to adjust the parameter is satisfied when the ratio of a number of SCNs corresponding to an ith iteration to a total number of check nodes is less than a first threshold value.

A second condition to adjust the parameter is satisfied when the ratio of a number of variable nodes of which an APP corresponding to the ith iteration is equal to or greater than a first set value to a total number of variable nodes is less than a second threshold value.

A third condition to adjust the parameter is satisfied when the ratio of a number of check nodes of which minimum value corresponding to the ith iteration is equal to or greater than a second set value to a total number of check nodes is less than a third threshold value.

At least one of the first set value or the second set value may be experimentally determined or be determined according to a quantization level. For example, at least one of the first set value or the second set value may be set to be greater for a higher quantization level and set to be smaller for a lower quantization level.

The first to third threshold values may be experimentally determined.

FIG. 10 is an example diagram illustrating a process of adjusting a parameter based on some implementations of the disclosed technology.

In the embodiment described with reference to FIG. 10, it is assumed that the total number of check nodes is 100, the number of SCNs corresponding to the ith iteration is 50, and the first threshold value is set to 60%.

The ratio of the number of SCNs to the total number of check nodes is 50%, which is less than the first threshold value. Therefore, the first condition defined in the reliability determination policy shown in FIG. 9 is satisfied.

When the first condition is satisfied, initial LLR values of variable nodes can be adjusted. For example, in FIG. 10, initial LLR value '+3' may be adjusted to '+2,' initial LLR value '−4' may be adjusted to '−3,' initial LLR value '−2' may be adjusted to '−1,' and initial LLR value '+4' may be adjusted to '+3.'

Figure 11:
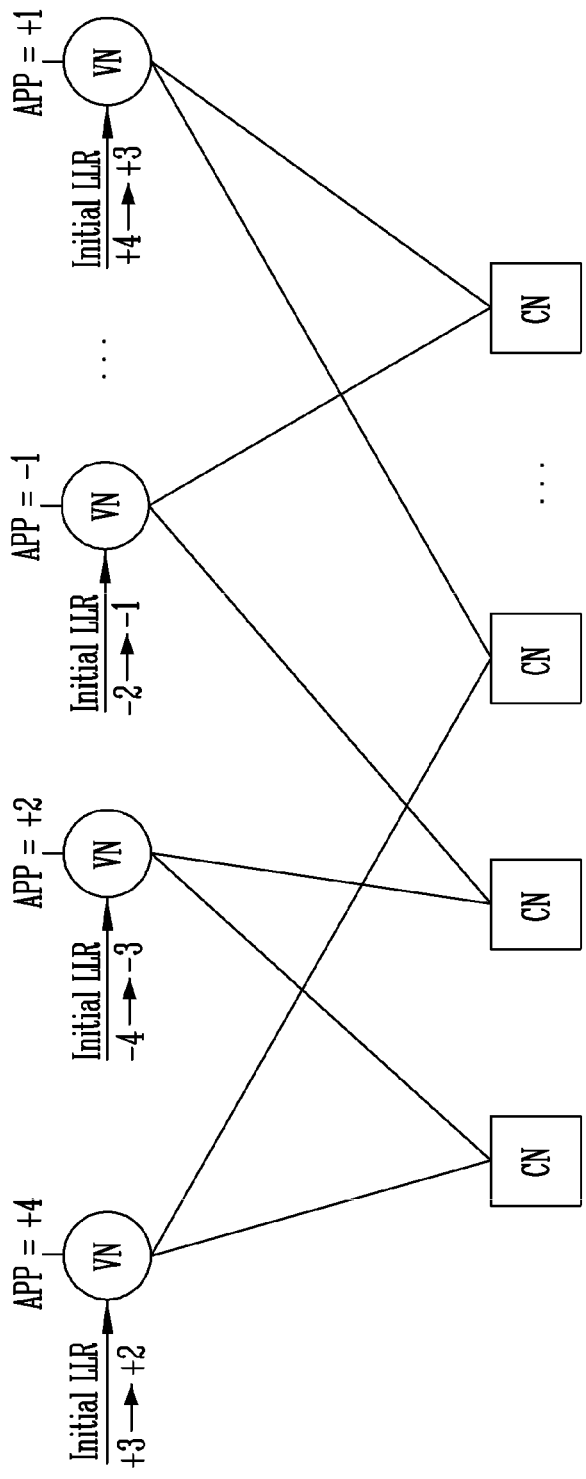
FIG. 11 is an example diagram illustrating a process of adjusting a parameter based on some implementations of the disclosed technology.

FIG. 11 is an example diagram illustrating a process of adjusting a parameter based on some implementations of the disclosed technology.

In the embodiment described with FIG. 11, it is assumed that the total number of variable nodes is 200, the first set value is 3, the number of variable nodes of which an APP is equal to or greater than the first set value is 100, and the second threshold value is set to 60%.

The ratio of the number of variable nodes of which an APP is equal to or greater than 3 to the total number of variable nodes is 50%, which is less than the second threshold value. Therefore, the second condition defined in the reliability determination policy shown in FIG. 9 is satisfied.

When the second condition is satisfied, initial LLR values of variable nodes can be adjusted. FIG. 11 illustrate an example in which the initial LLR values are adjusted identically to those shown in FIG. 10.

Figure 12:
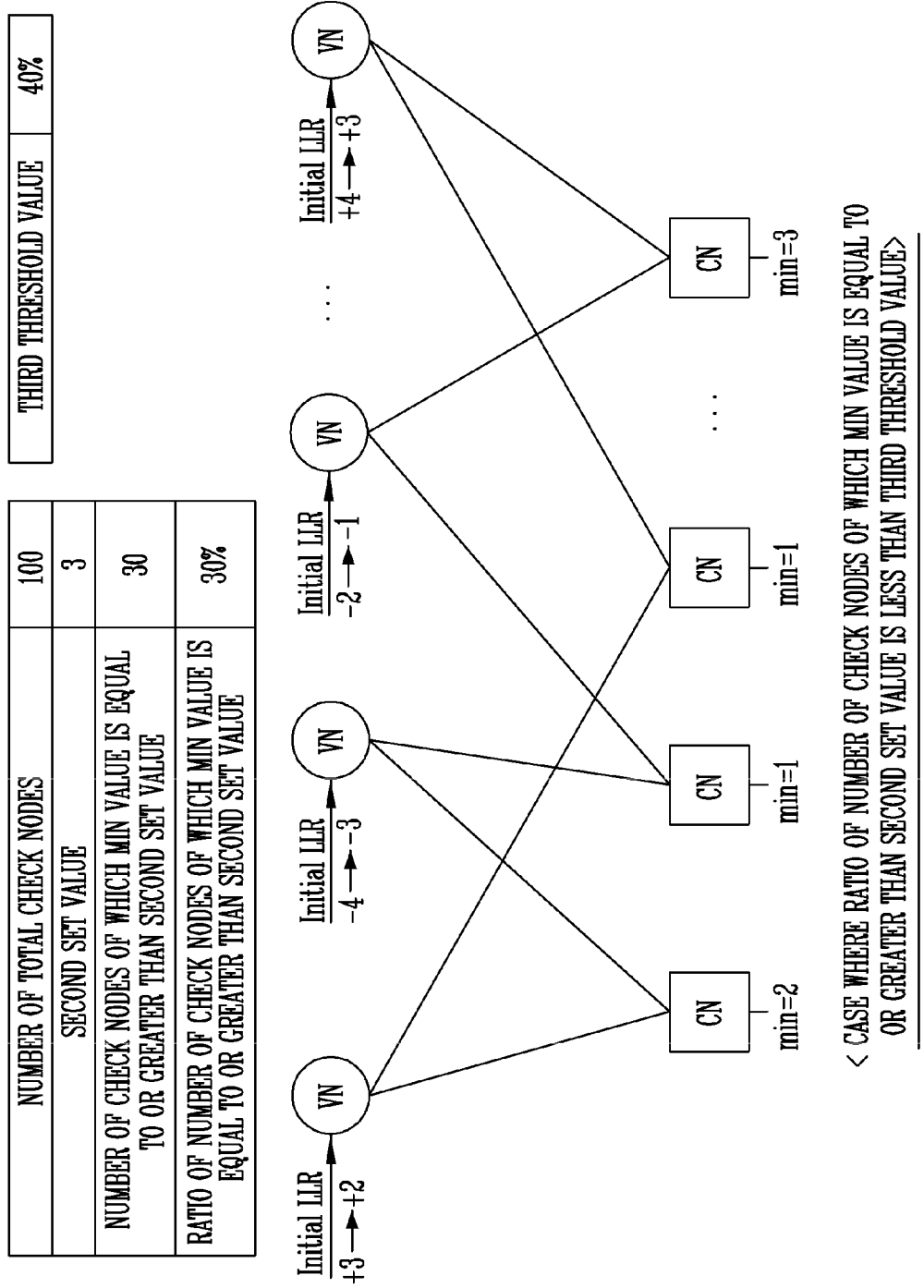
FIG. 12 is an example diagram illustrating a process of adjusting a parameter based on some implementations of the disclosed technology.

FIG. 12 is an example diagram illustrating a process of adjusting a parameter based on some implementations of the disclosed technology.

In the embodiment described with reference to FIG. 12, it is assumed that the total number of check nodes is 100, the second set value is 3, the number of check nodes of which minimum value is equal to or greater than the second set value is 30, and the third threshold value is set to 40%.

The ratio of the number of check nodes of which minimum value is equal to or greater than the second set value to the total number of check nodes is 30%, which is less than the third threshold value. Therefore, the third condition defined in the reliability determination policy shown in FIG. 9 is satisfied.

When the third condition is satisfied, initial LLR values of variable nodes can be adjusted. FIG. 12 shows an example in which the initial LLR values are adjusted identically to those shown in FIG. 10.

In the embodiments described with reference to FIGS. 10 to 12, the magnitudes (absolute values) of the LLR values are decreased. However, in some embodiments, the adjustment can be made to increase the magnitudes of the initial LLR values of the respective variable nodes.

Also, in the embodiments described with reference to FIGS. 10 to 12, the initial LLR value is adjusted. However, other parameters than the initial LLR values can be adjusted. For example, the scaling factor or the scaling offset may be adjusted. Thus, in some implementations, at least one of the initial LLR value, the scaling factor, or the scaling offset can be adjusted.

Figure 13:
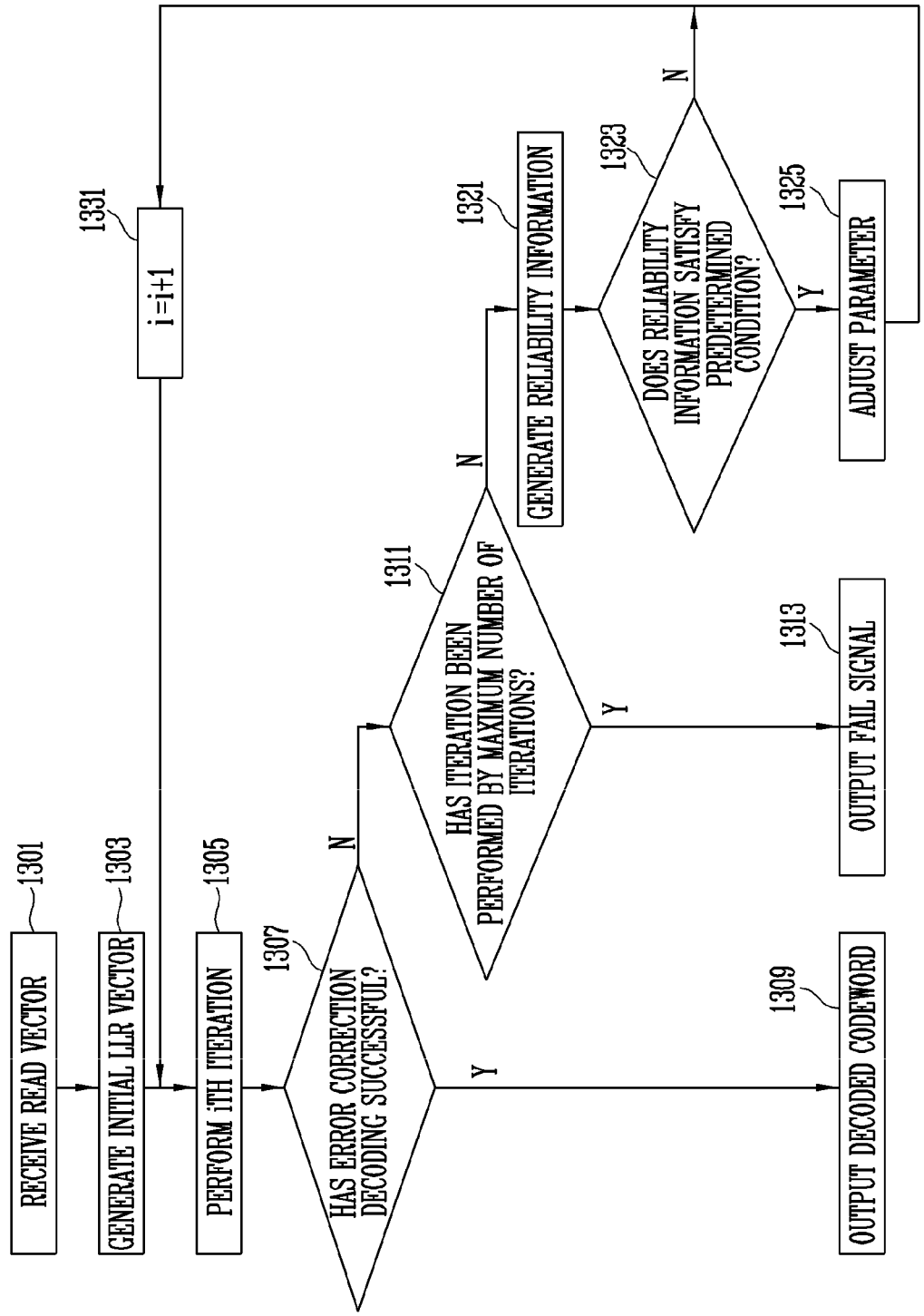
FIG. 13 is an example flowchart illustrating an operating method of the error correction decoder based on some implementations of the disclosed technology.

FIG. 13 is an example flowchart illustrating an operating method of the error correction decoder based on some implementations of the disclosed technology.

In step 1301, the error correction decoder may receive at least one read vector corresponding to a codeword.

In step 1303, the error correction decoder may generate an initial LLR vector, based on the received read vector.

In step 1305, the error correction decoder may perform an ith iteration according to the iterative decoding scheme.

In step 1307, the error correction decoder may determine whether the error correction decoding has been successful in the ith iteration. When the error correction decoding has been successful (Y), step 1309 may be performed. When the error correction decoding has been unsuccessful (N), step 1311 may be performed.

In the step 1309, the error correction decoder may output a hard decision vector corresponding to the ith iteration as a decoded codeword.

In the step 1311, the error correction decoder may determine whether the iteration has been performed by a maximum number of iterations (I). When it is determined that the iteration is performed by the maximum number of iterations (I), i.e., 'Y' in the step 1311, step 1313 may be performed. When it is determined that the iteration is not performed by the maximum number of iterations (I), i.e., 'N' in the step 1311 (N), step 1321 may be performed.

In the step 1313, the error correction decoder may output a fail signal representing that the error correction decoding has failed since the error correction decoder has not generated any valid codeword by performing the iteration by the maximum number of iterations (I).

In the step 1321, the error correction decoder may generate reliability information. The reliability information may be generated corresponding to the ith iteration. The reliability information may include information associated with, for example, at least one of a number of SCNs, APPs of variable nodes, or minimum values of check nodes.

In an embodiment, the reliability information may include at least one of information on a ratio of a number of SCNs corresponding to the ith iteration to a total number of check nodes, information on a ratio of a number of variable nodes of which an APP corresponding to the ith iteration is equal to or greater than a first set value to a total number of variable nodes, or information on a ratio of a number of check nodes of minimum value corresponding to the ith iteration is equal to or greater than a second set value to a total number of check nodes.

In step 1323, the error correction decoder may determine whether the reliability information satisfies a predetermined condition. For example, the error correction decoder may determine whether the reliability information satisfies at least one condition among conditions defined in the reliability determination policy. When the reliability information satisfies at least one condition among the conditions defined in the reliability determination policy, i.e., 'Y' in the step 1323, step 1325 may be performed. When the reliability information does not satisfy any condition among the conditions defined in the reliability determination policy, i.e., 'N' in the step 1323, the value of i is increased by one in the step 1331. Thus, an (i+1)th iteration may be performed in the step 1305. In some embodiments, the step 1325 can be performed when the reliability information satisfies two or more conditions among the conditions defined in the reliability determination policy instead of at least one condition.

In the step 1325, the error correction decoder may adjust at least one parameter among parameters used for the iterative decoding scheme.

In an embodiment, the error correction decoder may adjust initial LLR values of variable nodes. For example, the error correction decoder may decrease the initial LLR values of all the variable nodes by the same amount or increase the initial LLR values of all the variable nodes by the same amount. The adjustment of the initial LLR values can be made such that the magnitudes (absolute values) of the initial LLR values increase or decrease while the sign of each of the initial LLR values is maintained.

In an embodiment, when the scaled min-sum algorithm is used, the error correction decoder may decrease a scaling factor by a set value, or increase the scaling factor by the set value.

In an embodiment, when the scaled min-sum algorithm is used, the error correction decoder may decrease a scaling offset by a set value, or increase the scaling offset by the set value.

Once at least one parameter is adjusted at the step 1325, the value of i is increased to (i+1) in the step 1331 and the (i+1)th iteration may be performed in the step 1305.

Figure 14:
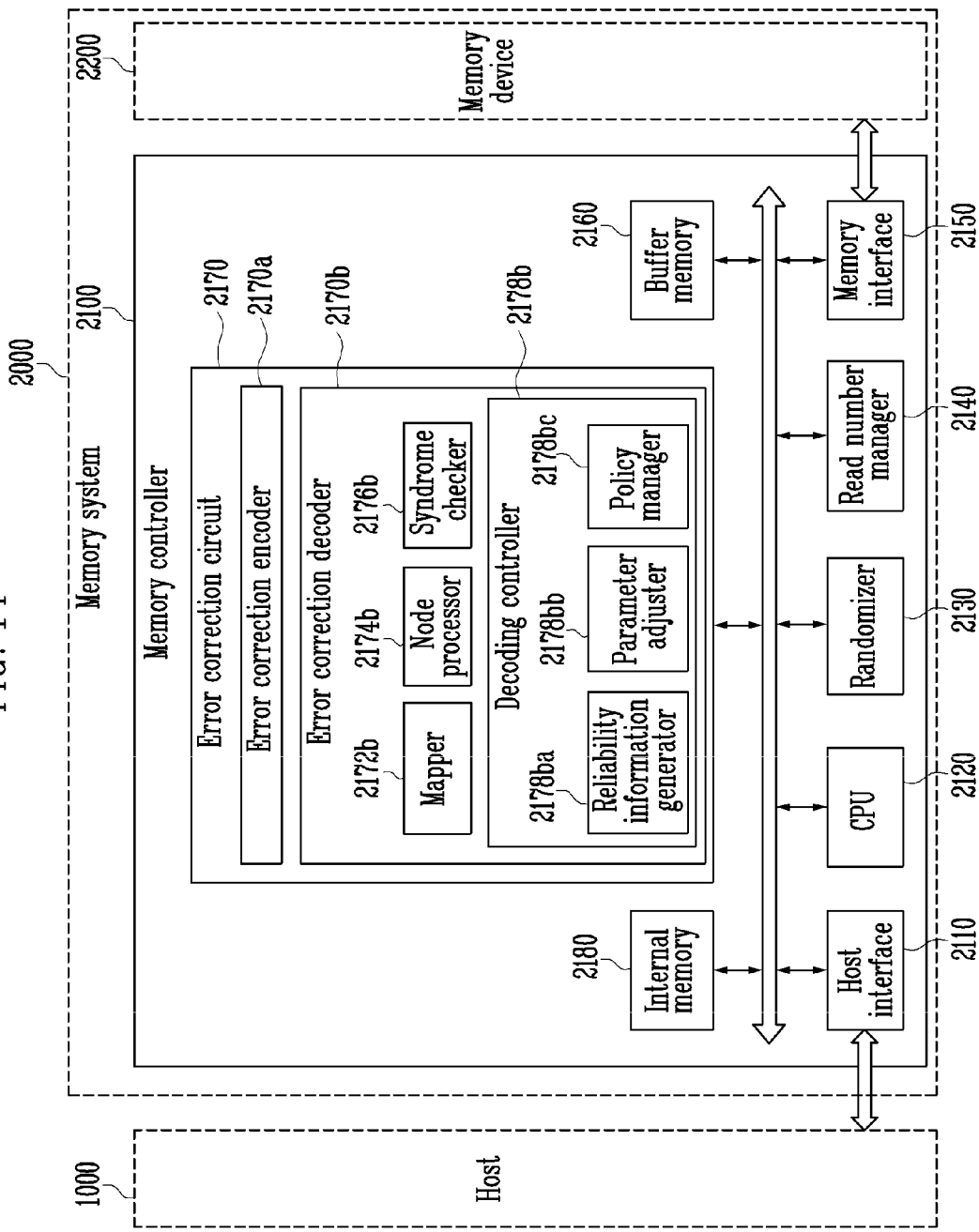
FIG. 14 is an example diagram illustrating a memory system based on some implementations of the disclosed technology.

FIG. 14 is a diagram illustrating a memory system based on some implementations of the disclosed technology.

Referring to FIG. 14, the memory system 2000 may include a memory device 2200 configured to store data and a memory controller 2100 configured to control the memory device 2200 in response to a request from a host 1000.

The host 1000 may be a device or system configured to store data in the memory system 2000 or retrieve data from the memory system 2000. For example, the host 1000 may include at least one of a computer, a portable digital device, a tablet, a digital camera, a digital audio player, a television, a wireless communication device, a cellular phone, or others.

The memory controller 2100 may control overall operations of the memory system 2000. The memory controller 2100 may control the memory device 2200 to perform various operations in response to a request from the host 1000. For example, the memory controller 2100 may control the memory device 2200 to perform a program operation, a read operation, and an erase operation. In the program operation, the memory controller 2100 may transmit a program command, an address and a codeword to the memory device 2200. In the read operation, the memory controller 2100 may transmit a read command and an address to the memory device 2200, and receive read data corresponding to the codeword from the memory device 2200. In the erase operation, the memory controller 2100 may transmit an erase command and an address to the memory device 2200.

The memory controller 2100 may include a host interface 2110, a central processing unit (CPU) 2120, a randomizer 2130, a read number manager 2140, a memory interface 2150, a buffer memory 2160, an error correction circuit 2170, and an internal memory 2180.

In some embodiments, at least one of the above-described components may be omitted in the memory system 2000. For example, the randomizer 2130 may be omitted in an embodiment in which randomization on a codeword is not performed, and the read number manager 2140 may be omitted in an embodiment in which a parameter is adjusted regardless of a read number.

The host interface 2110, the randomizer 2130, the read number manager 2140, the memory interface 2150, the buffer memory 2160, the error correction circuit 2170, and the internal memory 2180 may be controlled by the CPU 2120.

The host interface 2110 may transfer a program request, a read request and an erase request, which are received from the host 1000, to the CPU 2120. In a program operation, the host interface 2110 may receive original data corresponding to the program request from the host 1000, and store the received original data in the buffer memory 2160. In a read operation, the host interface 2110 may transmit a decoded codeword stored in the buffer memory 2160 to the host

1000. The host interface 2110 may perform communication with the host 1000 by using various interface protocols. For example, the host interface 2110 may communicate with the host 1000 by using at least one interface protocol among a Non-Volatile Memory express (NVMe), a Peripheral Component Interconnect-Express (PCI-E), an Advanced Technology Attachment (ATA), a Serial ATA (SATA), a Parallel ATA (PATA), a Universal Serial Bus (USB), a Multi-Media Card (MMC), an Enhanced Small Disk Interface (ESDI), an Integrated Drive Electronics (IDE), a Mobile Industry Processor Interface (MIPI), a Universal Flash Storage (UFS), a Small Computer System Interface (SCSI), or a Serial Attached SCSI (SAS). However, embodiments of the disclosed are not limited thereto and thus the host interface 2110 can communicate with the host 1000 by using other communication protocols.

The CPU 2120 may perform various calculations or generate a command and an address so as to control the memory device 2200. For example, the CPU 2120 may generate various commands and addresses for a program operation, a read operation, an erase operation, and others, in response to a request transferred from the host interface 2110.

When the CPU 2120 receives a program request from the host interface 2110, the CPU 2120 may control the error correction circuit 2170 to perform the error correction encoding on original data stored in the buffer memory 2160.

In an embodiment in which randomization on a codeword is not performed, when the CPU 2120 receives a notification that a codeword has been generated from the error correction circuit 2170, the CPU 2120 may control the memory interface 2150 such that a program command, an address, and the codeword stored in the buffer memory 2160 can be transmitted to the memory device 2200.

In an embodiment in which randomization on a codeword is performed, when the CPU 2120 receives a notification that a codeword has been generated from the error correction circuit 2170, the CPU 2120 may control the randomizer 2130 to perform randomization on the codeword stored in the buffer memory 2160. When the CPU 2120 receives a notification that a randomized codeword has been generated from the randomizer 2130, the CPU 2120 controls the memory interface 2150 such that a program command, an address, and the randomized codeword stored in the buffer memory 2160 can be transmitted to the memory device 2200.

When the CPU 2120 receives a read request from the host interface 2110, the CPU 2120 may control the memory interface 2150 such that a read command and an address can be transmitted to the memory device 2200.

In an embodiment, the CPU 2120 may provide information on a read-requested address to the read number manager 2140.

In an embodiment in which randomization on a codeword is not performed, when the CPU 2120 receives a notification that read data has been received from the memory interface 2150, the CPU 2120 may control the error correction circuit 2170 to perform the error correction decoding on the read data stored in the buffer memory 2160.

In an embodiment in which randomization on a codeword is performed, when the CPU 2120 receives a notification that randomized read data has been received from the memory device 2150, the CPU 2120 may control the randomizer 2130 to perform derandomization on the randomized read data stored in the buffer memory 2160. When the CPU 2120 receives a notification that derandomized read data has been generated from the randomizer 2130, the CPU 2120 may control the error correction circuit 2170 to perform the error correction decoding on the derandomized read data stored in the buffer memory 2160.

When the CPU 2120 received a notification that a decoded codeword has been generated from the error correction circuit 2170, the CPU 2120 may control the host interface 2110 such that the decoded codeword stored in the buffer memory 2160 can be transmitted to the host 1000.

The randomizer 2130 may perform randomization on a codeword stored in the buffer memory 2160. The randomization may mean that a symbol value is converted such that a number of '0' symbols included in the codeword and a number of '1' symbols included in the codeword become similar to each other. For example, when 7-bit codeword includes two '0' symbols and five '1' symbols, some of the '1' symbols are converted into '0' symbols, so that the number of '0' symbols and the number of '1' symbols in the codeword can become similar to each other. For example, the randomizer 2130 may generate a randomized codeword by calculating seed data and the codeword. The randomizer 2130 may manage index information of a symbol converted in the randomization process. The randomizer 2130 may store the randomized codeword in the buffer memory 2160, and notify the CPU 2120 that the randomized codeword has been generated.

The randomizer 2130 may perform derandomization on the randomized read data stored in the buffer memory 2160. For example, the randomizer 2130 may convert some of the symbols included in the randomized read data with reference to the managed index information. The randomizer 2130 may store the derandomized data in the buffer memory 2160, and notify the CPU 2120 that the derandomized read data has been generated.

The read number manager 2140 may manage a read number with respect to storage areas included in the memory device 2200. For example, the read number manager 2140 may mange a read number with respect to each of the storage areas included in the memory device 2200, based on information on the read-requested address received from the CPU 2120. For example, the read number manager 2140 may update a read number with respect to each of the storage areas based on the information on the read-requested address. The read number manager 2140 may provide the error correction circuit 2170 with information on the managed read number. In some embodiments, each of the storage areas may correspond to one page in which one codeword is stored, or correspond to one memory block including a plurality of pages.

The memory interface 2150 may perform communication with the memory device 2200 by using various interface protocols.

In a program operation, the memory interface 2150 may transmit, to the memory device 2200, a program command and an address, which are received from the CPU 2120, and a codeword (or randomized codeword) stored in the buffer memory 2160.

In a read operation, the memory interface 2150 may transmit a read command and an address, which are received from the CPU 2120, to the memory device 2200. In the read operation, the memory interface 2150 may store read data (or randomized read data) received from the memory device 2200 in the buffer memory 2160, and notify the CPU 2120 that the read data (or the randomized read data) has been received.

The buffer memory 2160 may temporarily store data while the memory controller 2100 is controlling the memory device 2200.

In a program operation, the buffer memory 2160 may store original data received from the host 1000 through the host interface 2110. In the program operation, the buffer memory 2160 may store at least one of a codeword received from the error correction circuit 2170 or a randomized codeword received from the randomizer 2130.

In a read operation, the buffer memory 2160 may store read data (or randomized read data) received from the memory device 2200 through the memory interface 2150. In the read operation, the buffer memory 2160 may store a decoded codeword received from the error correction circuit 2170.

The error correction circuit 2170 may perform the error correction encoding on the original data, and may perform the error correction decoding on the read data (or derandomized read data). The error correction circuit 2170 may have a predetermined error correction capability. For example, when a number of error bits that do not exceed the error correction capability are included in the read data (or derandomized read data), the error correction circuit 2170 may detect and correct an error included in the read data (or the derandomized read data). The maximum number of error bits that do not exceed the error correction capability of the error correction circuit 2170 may be regarded as a maximum allowable number of error bits. The error correction circuit 2170 may be an error correction circuit that uses an LDPC code.

The error correction circuit 2170 may include an error correction encoder 2170a and an error correction decoder 2170b.

The error correction encoder 2170a may generate a codeword by performing the error correction encoding on the original data stored in the buffer memory 2160. The error correction encoder 2170a may store the generated codeword in the buffer memory 2160, and notify the CPU 2120 that the codeword has been generated. The basic configuration and operation of the error correction encoder 2170a may be identical to those of the error correction encoder 100 described with reference to FIG. 1.

The error correction decoder 2170b may generate a decoded codeword by performing the error correction decoding on the read data (or derandomized read data) stored in the buffer memory 2160. The error correction decoder 2170b may store the decoded codeword in the buffer memory 2160, and notify the CPU 2120 that the decoded codeword has been generated. When the error included in the read data (or the derandomized read data) is not correctable, the error correction decoder 2170b may notify the CPU 2120 that the error correction decoding has failed.

The error correction decoder 2170b may include a mapper 2172b, a node processor 2174b, a syndrome checker 2176b, and a decoding controller 2178b. The basic configuration and operation of the mapper 2172b, the node processor 2174b, and the syndrome checker 2176b may be identical to those of the mapper 210, the node processor 220, and the syndrome checker 230, which are described with reference to FIG. 2.

The decoding controller 2178b may include a reliability information generator 2178ba, a parameter adjuster 2178bb, and a policy manager 2178bc. The basic configuration and operation of the reliability information generator 2178ba, the parameter adjuster 2178bb, and the policy manager 2178bc may be identical to those of the reliability information generator 242, the parameter adjuster 244, and the policy manager 246.

In some implementations, the reliability information generator 2178ba may determine when to start the generation of reliability information, e.g., at which iteration the generation of relatability information starts. For example, the reliability information generator 2178ba may determine the iteration number in which the generation of reliability information starts based on information on a read number received from the read number manager 2140. For example, the reliability information generator 2178ba may determine that the generation of reliability information starts earlier, e.g., when the iteration number is relatively smaller, for a greater read number of a storage area in which read data (or derandomized read data) is stored.

In some implementations, the parameter adjuster 2178bb may adjust a parameter based on a read number. For example, the parameter adjuster 2178bb may determine an amount of adjustment of the parameter based on information on a read number which is received from the read number manager 2140. For example, the parameter adjuster 2178bb may determine to make a greater amount of adjustment of the parameter for a greater read number.

The internal memory 2180 may be used as a storage that stores various information necessary for an operation of the memory controller 2100. The internal memory 2180 may store a plurality of tables. In an embodiment, the internal memory 2180 may store an address mapping table in which logical and physical addresses are mapped. In an embodiment, the internal memory 2180 may store index information of symbols converted in a randomization process.

The memory device 2200 may perform a program operation, a read operation, an erase operation, and others, under the control of the memory controller 2100. In some implementations, the memory device 2200 may be implemented as a volatile memory device. The volatile memory device stores data only when power is supplied. Thus, the stored data disappears when the supply of power is interrupted. In some implementations, the memory device 2200 may be implemented as a nonvolatile memory device. The data stored in the nonvolatile memory device is retained even when the supply of power is interrupted.

The memory device 2200 may receive a command, an address, and a codeword from the memory controller 2100, and store the codeword, based on the command and the address.

The memory device 2200 may perform a read operation on a codeword, based on the command and the address, which are received from the memory controller 2100, and provide read data to the memory controller 2100.

Figure 15:
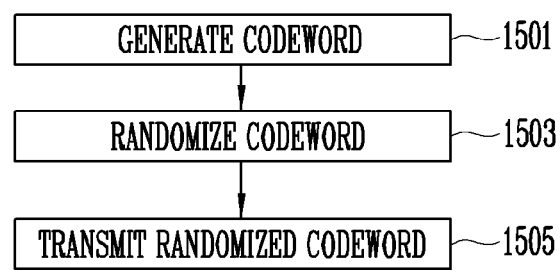
FIG. 15 is an example flowchart illustrating an operating method of a memory controller based on some implementations of the disclosed technology.

FIG. 15 is an example flowchart illustrating an operating method of a memory controller based on some implementations of the disclosed technology.

In step 1501, the memory controller may generate a codeword. For example, the memory controller may generate the codeword by performing the error correction encoding on original data received from the host.

In step S1503, the memory controller may randomize the codeword.

In step S1505, the memory controller may transmit a program command, an address, and the randomized codeword to the memory device such that the randomized codeword can be stored in the memory device.

In some embodiments, the step 1503 may be omitted. In this case, in the step S1505, the program command, the address, and the codeword may be transmitted to the memory device.

FIG. 16 is an example flowchart illustrating an operating method of a memory controller based on some implementations of the disclosed technology.

In step 1601, the memory controller may generate a read command and an address, and transmit the read command and the address to the memory device. For example, the memory controller may generate a read command and an address in response to a read request received from the host.

In step 1603, the memory controller may manage a read number of storage areas included in the memory device. For example, the memory controller may increase a read count of a storage area corresponding to the address generated in the step S1601. In some implementations, the memory controller may increase the read count by, for example, 1.

In step 1605, the memory controller may determine when to start the reliability determination, e.g., at which iteration the reliability determination starts. For example, the memory controller may determine the iteration number in which the reliability determination starts, based on the read count of the storage area corresponding to the address generated in the step 1601. For example, the memory controller may determine that the reliability determination starts earlier, e.g., when the iteration number is relatively smaller, for a higher read count of the storage area. The determined iteration number may be stored in the memory controller.

In step 1607, the memory controller may receive at least one read data corresponding to a codeword from the memory device. When the read data received from the memory device is randomized read data, the memory controller may generate derandomized read data by derandomizing the randomized read data.

In step 1609, the memory controller may generate initial LLR values, based on at least one read data (or derandomized read data) corresponding to one codeword.

In step 1611, the memory controller may perform an ith iteration according to the iterative decoding scheme.

In step 1613, the memory controller may determine whether the error correction decoding has been successful in the ith iteration. When the error correction decoding passes, i.e., 'Y' in the step 1613, step 1615 may be performed. When the error correction decoding has been not successful, i.e., 'N' in the step 1613, step 1623 may be performed.

In the step 1615, the memory controller may output a hard decision vector corresponding to the ith iteration as a decoded codeword.

In the step 1623, the memory controller may determine whether the iteration has been performed by a maximum number of iterations (I). When it is determined that the iteration is performed by the maximum number of iterations (I), i.e., 'Y' in the step 1623, step 1625 may be performed. When it is determined that the iteration is not performed by the maximum number of iterations (I), i.e., 'N' in the step 1623, step 1633 may be performed.

In the step 1625, the memory controller may output a fail signal representing that the error correction decoding has failed since the memory controller has not generated any valid codeword by performing the iteration by the maximum number of iterations (I).

In the step 1633, the memory controller may check whether the current iteration number has reached the determined iteration number to start the reliability determination. When the current iteration reaches the determined iteration number in which the reliability determination starts, i.e., 'Y' in step 1633, step 1635 may be performed. When the current iteration number does not reach the determined iteration number in which the reliability determination starts, i.e., 'N' in step 1633, the value of i is increased by one in the step 1641 and thus, an (i+1)th iteration can be performed in the step 1611.

In the step 1635, the reliability determination begins and thus the memory controller generates reliability information. The reliability information may be generated corresponding to the ith iteration. The reliability information may include information associated with, for example, at least one of a number of SCNs, APPs of variable nodes, or minimum values of check nodes.

In an embodiment, the reliability information may include at least one of information on a ratio of a number of SCNs corresponding to the ith iteration to a total number of check nodes, information on a ratio of a number of variable nodes of which an APP corresponding to the ith iteration is equal to or greater than a first set value to a total number of variable nodes, or information on a ratio of a number of check nodes of minimum value corresponding to the ith iteration is equal to or greater than a second set value to a total number of check nodes.

In step 1637, the memory controller may determine whether the reliability information satisfies a predetermined condition. For example, the memory controller may determine whether the reliability information satisfies at least one condition among conditions defined in a reliability determination policy. When the reliability information satisfies at least one condition among the conditions defined in the reliability determination policy, i.e., 'Y' in the step 1637, step 1639 may be performed. When the reliability information does not satisfy any condition among the conditions defined in the reliability determination policy (N), i.e., 'N' in the step 1637, the value of i is increased by one in the step 1641 and thus the (i+1)th iteration may be performed in the step 1611. In some embodiments, the step 1639 can be performed when the reliability information simultaneously satisfies two or more conditions among the conditions defined in the reliability determination policy, instead of at least one condition.

In the step S1639, the memory controller may adjust at least one parameter among parameters used for the iterative decoding scheme.

In an embodiment, the memory controller may adjust initial LLR values of variable nodes. For example, the memory controller may decrease the initial LLR values of all the variable nodes by the same amount or increase the initial LLR values of all the variable nodes by the same amount. The adjustment of the initial LLR values can be made such that the magnitudes (absolute values) of the initial LLR values increase or decrease while the sign of each of the initial LLR values is maintained.

In an embodiment, when the scaled min-sum algorithm is used, the memory controller may decrease a scaling factor by a set value, or increase the scaling factor by the set value.

In an embodiment, when the scaled min-sum algorithm is used, the error correction decoder may decrease a scaling offset by a set value, or increase the scaling offset by the set value.

Once at least one parameter is adjusted at the step 1639, the value of i is increased to (i+1) in the step 1641 and the (i+1)th iteration may be performed in the step 1611.

FIG. 17 is an example table illustrating a reliability determination policy based on some implementations of the disclosed technology.

The reliability determination policy may define a condition associated with at least one of a number of SCNs, APPs of variable nodes, minimum values of check nodes, or hard decision values of variable nodes. The table as shown in FIG. 17 includes an additional fourth condition, while the first to third conditions are same as those as shown in FIG. 9. As an example, the fourth condition in FIG. 17 is associated with hard decision values of variable nodes. The conditions as shown in FIG. 17 are examples only and thus the embodiments of the disclosed technology are not limited to the example shown in FIG. 17.

In the example of FIG. 17, the fourth condition is satisfied when the ratio of a number variable nodes of which hard decision value corresponding to the ith iteration is '1' to a number of total variable nodes is less than a fourth threshold value.

The fourth condition may be applied to an embodiment in which randomization on a codeword is performed. In the embodiment in which the randomization on the codeword is performed, when the ratio of the variable nodes whose hard decision value is '1' among the total variable nodes is low (e.g., less than the fourth threshold value), this may mean that the codeword is converging in a wrong direction. Therefore, it is necessary to adjust a parameter used for the iterative decoding scheme such that the codeword can converge in a correct direction. Therefore, the fourth condition is defined to help the codeword to converge in a correct direction when the randomization on the codeword is performed and the ratio of the variable nodes with the hard decision value of '1' is low. The fourth threshold value may be experimentally determined.

Figure 18:
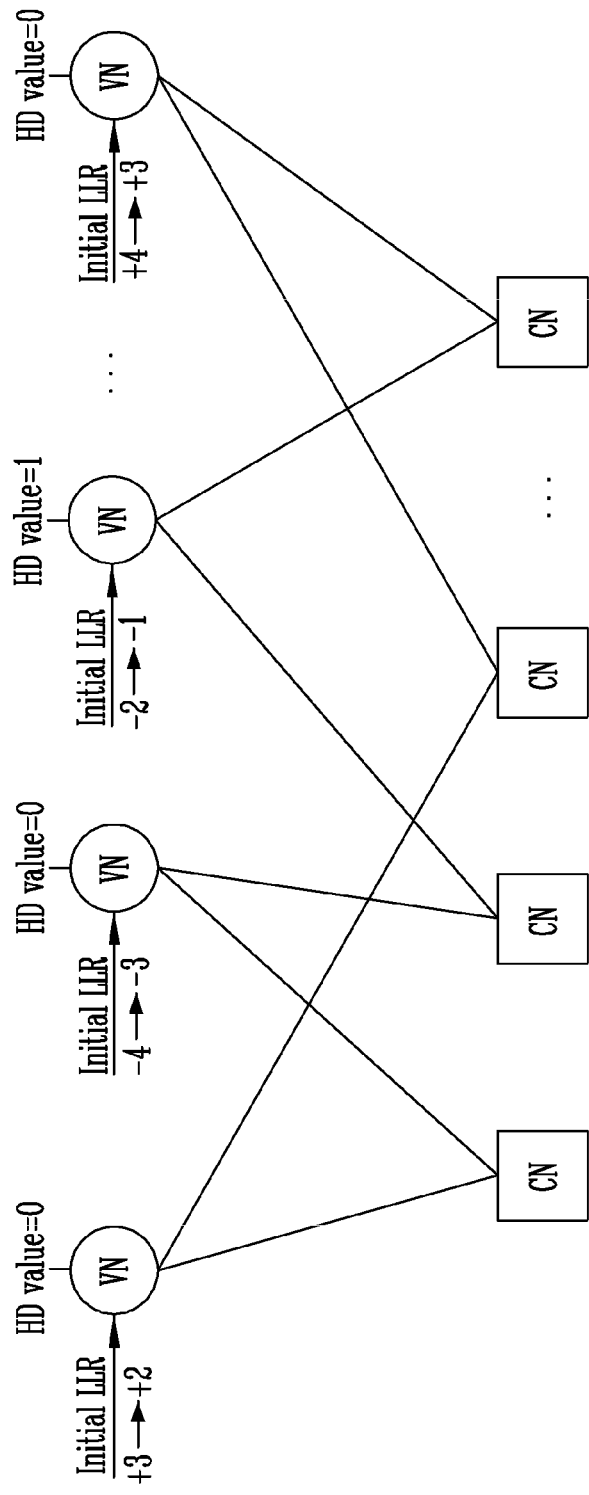
FIG. 18 is an example diagram illustrating a process of adjusting a parameter based on some implementations of the disclosed technology.

FIG. 18 is an example view illustrating a process of adjusting a parameter based on some implementations of the disclosed technology.

In the embodiment described with reference to FIG. 18, it is assumed that the total number of variable nodes is 200, the number of variable nodes of which hard decision (HD) value is '1' is 60, and the fourth threshold value is set to 40%.

The ratio of the number of variable nodes of which HD value is '1' to the total number of variable nodes is 30%, which is less than the fourth threshold value. Therefore, the fourth condition defined in the reliability determination policy shown in FIG. 17 is satisfied.

When the fourth condition is satisfied, initial LLR values of variable nodes may be adjusted. In FIG. 18, an example in which the initial LLR values are adjusted identically to those shown in FIG. 10.

In the embodiment described with reference to FIG. 18, the magnitudes (absolute values) of the initial LLR values are decreased. However, in some embodiments, the adjustment can be made to increase the magnitudes of the initial LLR values of the variable nodes.

Also, in the embodiment described with reference to FIG. 18, the initial LLR value is adjusted. However, other parameter than the initial LLR values can be adjusted. For example, the scaling factor or the scaling offset may be adjusted. Thus, in some implementations, at least one of the initial LLR value, the scaling factor, or the scaling offset can be adjusted.

Figure 19:
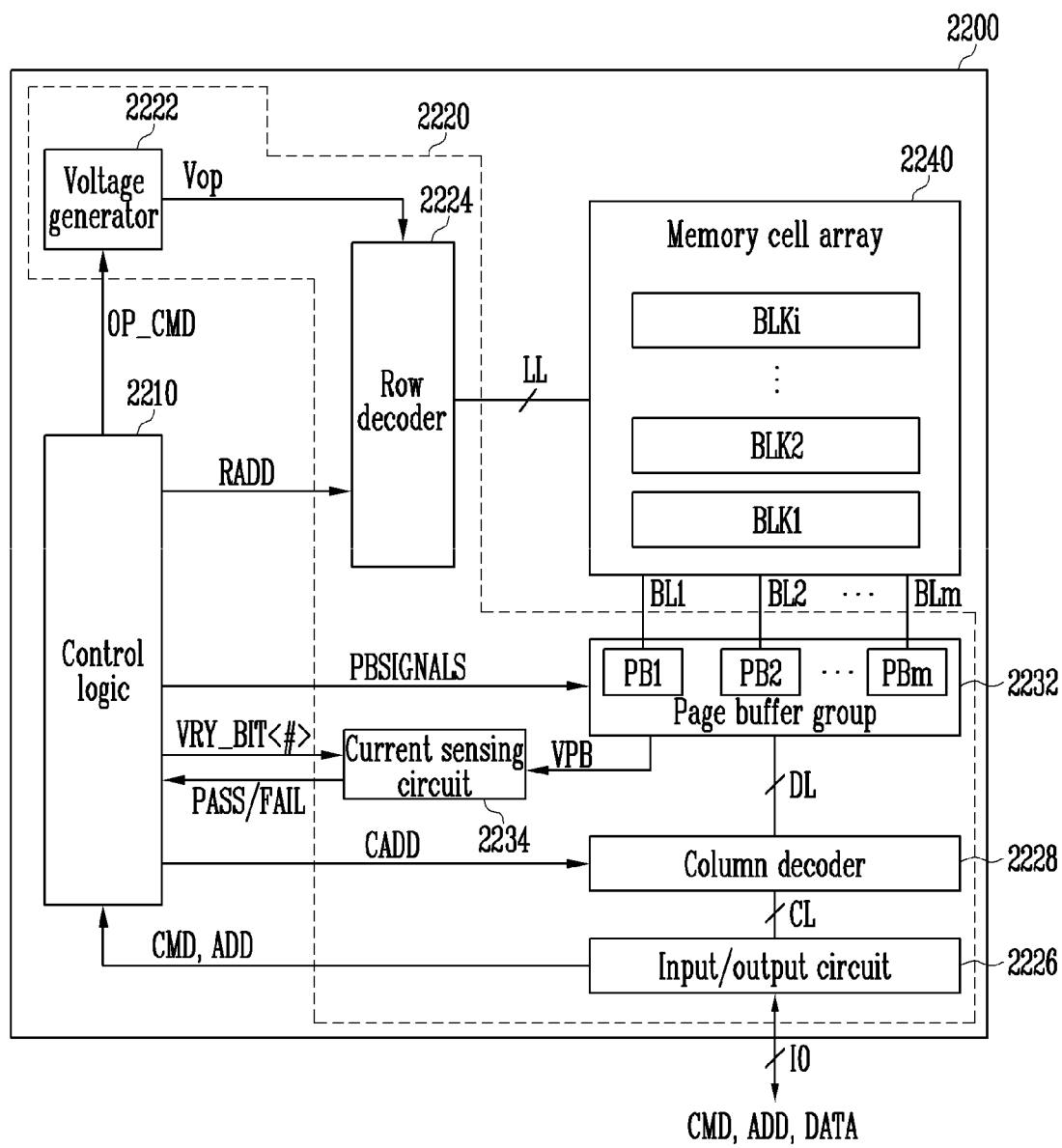
FIG. 19 is an example memory device based on some implementations of the disclosed technology.

FIG. 19 is an example diagram illustrating a memory device based on some implementations of the disclosed technology. The memory system shown in FIG. 14 can include the memory device shown in FIG. 19.

The memory device 2200 may include a control logic 2210, peripheral circuits 2220, and a memory cell array 2240. The peripheral circuits 2220 may include a voltage generator 2222, a row decoder 2224, the input/output circuit 2226, a column decoder 2228, a page buffer group 2232, and the current sensing circuit 2234.

The control logic 2210 may control the peripheral circuits 2220 under the control of the memory controller 2100 shown in FIG. 14. The control logic 2210 may control the peripheral circuits 2220 in response to a command (CMD) and an address (ADD), which are received from the memory controller 2100 through an input/output circuit 2226. For example, the control logic 2210 may output an operation signal (OP_CMD), a row address (RADD), a column address (CADD), page buffer control signals (PB SIGNALS), and an allow bit (VRY_BIT<#>) in response to the command (CMD) and the address (ADD). The control logic 2210 may determine whether a verify operation has passed or failed in response to a pass or fail signal (PASS) or (FAIL) received from a current sensing circuit 2234.

The peripheral circuits 2220 may perform a selective erase operation for erasing selected memory cells among memory cells included in a selected memory block under the control of the control logic 2210. Also, the peripheral circuits 2220 may perform a program operation for storing data in the memory cell array 2240, a read operation for outputting data stored in the memory cell array 2240, and an erase operation for erasing data stored in the memory cell array 2240.

The voltage generator 2222 may generate various operating voltages (Vop) used in program, read, and erase operations in response to the operation signal (OP_CMD) received from the control logic 2210. For example, the voltage generator 2222 may transfer a program voltage, a verify voltage, a pass voltage, a read voltage, an erase voltage, a turn-on voltage, and the like to the row decoder 2224.

The row decoder 2224 may transfer the operating voltages (Vop) to local lines (LL) connected to a selected memory block among memory blocks of the memory cell array 2240 in response to the row address (RADD) received from the control logic 2210. The local lines (LL) may include local word lines, local drain select lines, and local source select lines. In addition, the local lines (LL) may include various lines such as a source line, which are connected to the memory block.

The input/output circuit 2226 may transfer the command (CMD) and the address (ADD), which are received from the memory controller 2100, to the control logic 2210 through input/output lines (TO), or exchange data (DATA) with the column decoder 2228.

The column decoder 2228 may transfer data between the input/output circuit 2226 and the page buffer group 2232 in response to a column address (CADD) received from the control logic 2210. For example, the column decoder 2228 may exchange data with page buffers PB1 to PBm through data lines (DL), or exchange data with the input/output circuit 2226 through column lines (CL).

The page buffer group 2232 may be connected to bit lines BL1 to BLm commonly connected to memory blocks BLK1 to BLKi. The page buffer group 2232 may include a plurality of page buffers PB1 to PBm connected to the bit lines BL1 to BLm. For example, one page buffer may be connected to each of the bit lines. The page buffers PB1 to PBm may operate in response to the page buffer control signals (PB SIGNALS) received from the control logic 2210. For example, in a program operation, the page buffers PB1 to PBm may temporarily store program data received from the memory controller 2100, and adjust a voltage applied to the bit lines BL1 to BLm according to the program data. Also, in a read operation, the page buffers PB1 to PBm may temporarily store data received through the bit lines BL1 to BLm, or sense a voltage or current of the bit lines BL1 to BLm.

During a read or verify operation, the current sensing circuit 2234 may generate a reference current in response to the allow bit (VRY_BIT<#>) received from the control logic 2210, and output a pass signal (PASS) or a fail signal (FAIL)

by comparing a sensing voltage (VPB) received from the page buffer group 2232 with a reference voltage generated by the reference current.

The memory cell array 2240 may include a plurality of memory blocks BLK1 to BLKi in which data is stored. User data and various information required to perform an operation of the memory device 2200 may be stored in the memory blocks BLK1 to BLKi. The memory blocks BLK1 to BLKi may be implemented in a two-dimensional structure or a three-dimensional structure. In some implementations, the memory blocks can be configured to have an identical structure to one another. In some implementations, the memory blocks can be configured to have different structures from each other.

Figure 20:
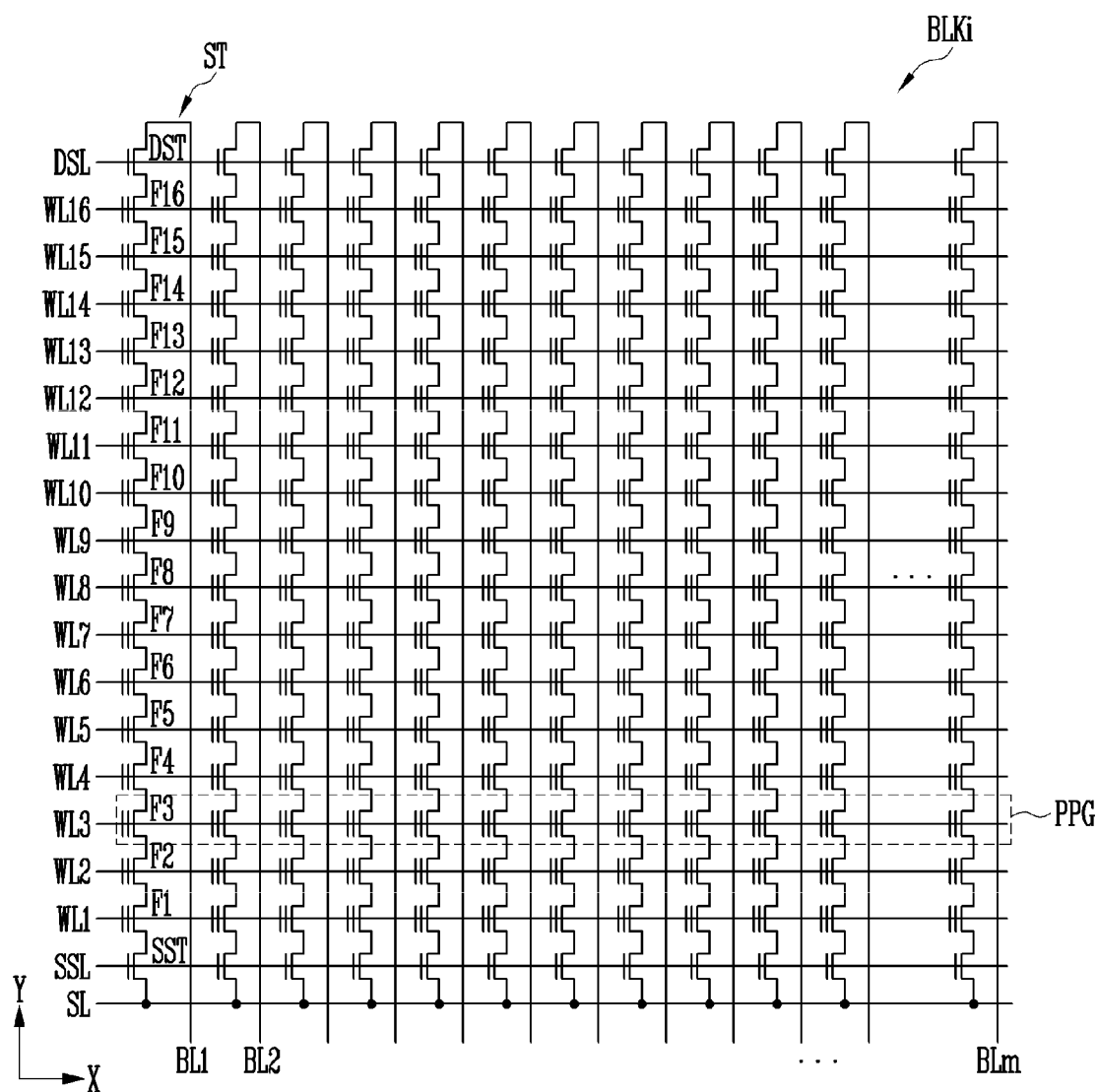
FIG. 20 is an example memory block based on some implementations of the disclosed technology.

FIG. 20 is an example diagram illustrating a memory block.

Referring to FIG. 20, in a memory block BLKi, a plurality of word lines arranged in parallel to one another may be connected between a first select line and a second select line. The first select line may be a source select line SSL, and the second select line may be a drain select line DSL. In some implementations, the memory block BLKi may include a plurality of strings ST connected between bit lines BL1 to BLm and a source line SL. The bit lines BL1 to BLm may be connected to the strings ST, respectively, and the source line SL may be commonly connected to the strings ST. The strings ST may be configured identically to one another. As an example, a string ST connected to a first bit line BL1 will be described in the below.

The string ST may include a source select transistor SST, a plurality of memory cells F1 to F16, and a drain select transistor DST, which are connected in series to each other between the source line SL and the first bit line BL1. At least one source select transistor SST and at least one drain select transistor DST may be included in one string ST, and memory cells of which number is greater than that of the memory cells F1 to F16 shown in the drawing may be included in one string ST.

A source of the source select transistor SST may be connected to the source line SL, and a drain of the drain select transistor DST may be connected to the first bit line BL1. The memory cells F1 to F16 may be connected in series between the source select transistor SST and the drain select transistor DST. Gates of the source select transistors SST included in different strings ST may be connected to the source select line SSL, gates of the drain select transistors DST included in different strings ST may be connected to the drain select line DSL, gates of the memory cells F1 to F16 included in different strings ST may be connected to a plurality of word lines WL1 to WL16. Among the memory cells included in different strings ST, the memory cells connected to the same word line may configure a physical page PPG. Therefore, the memory block BLKi can include a number of physical pages PPG, the number being same as the number of word lines WL1 to WL16 included in the memory block BLKi.

One memory cell may store one-bit data. The memory cell is referred to as a single level cell (SLC). One physical page PPG may store one logical page (LPG) data. One LPG data may include data bits of which number corresponds to that of cells included in one physical page PPG. For example, when two or more-bit data is stored in one memory cell, one physical page PPG may store two or more LPG data. For example, in a memory device driven as a Multi Level Cell (MLC) type, two LPG data may be stored in one physical page PPG. In a memory device driven as a Triple Level Cell (TLC) type, three LPG data may be stored in one physical page PPG.

Figure 21:
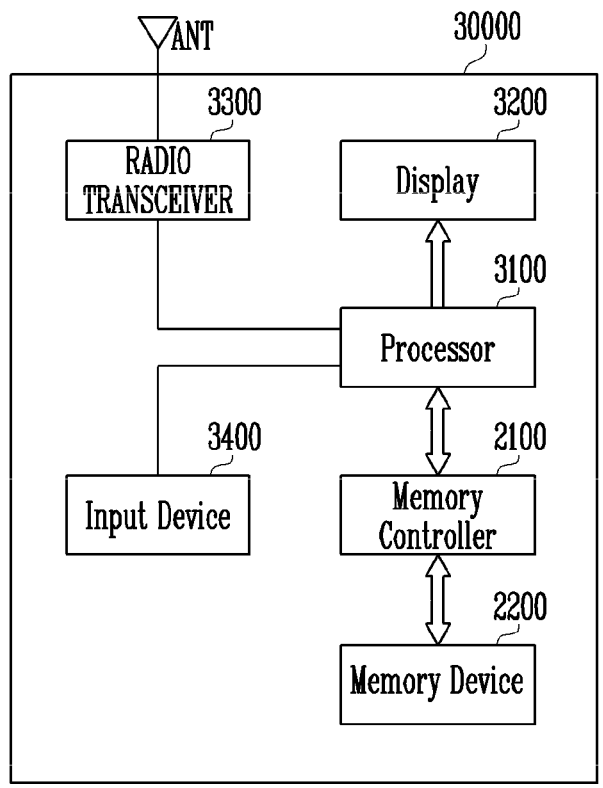
FIG. 21 is an example memory system including the memory controller shown in FIG. 14.

FIG. 21 is a diagram illustrating another example of the memory system including the memory controller shown in FIG. 14.

Referring to FIG. 21, the memory system 30000 may be implemented as a cellular phone, a smart phone, a tablet PC, a personal digital assistant (PDA), or a wireless communication device. The memory system 30000 may include a memory device 2200 and a memory controller 2100 capable of controlling an operation of the memory device 2200.

The memory controller 2100 may control a data access operation of the memory device 2200, e.g., a program operation, a read operation, an erase operation, or others, under the control of a processor 3100.

Data programmed in the memory device 2200 may be output through a display 3200 under the control of the memory controller 2100.

A radio transceiver 3300 may transmit/receive radio signals through an antenna ANT. For example, the radio transceiver 3300 may change a radio signal received through the antenna ANT into a signal that can be processed by the processor 3100. Therefore, the processor 3100 may process a signal output from the radio transceiver 3300 and transmit the processed signal to the memory controller 2100 or the display 3200. The memory controller 2100 may transmit the signal processed by the processor 3100 to the memory device 2200. Also, the radio transceiver 3300 may change a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 2100, data output from the radio transceiver 3300, or data output from the input device 3400 can be output through the display 3200.

In some embodiments, the memory controller 2100 capable of controlling an operation of the memory device 2200 may be implemented as a part of the processor 3100, or be implemented as a chip separate from the processor 3100.

Figure 22:
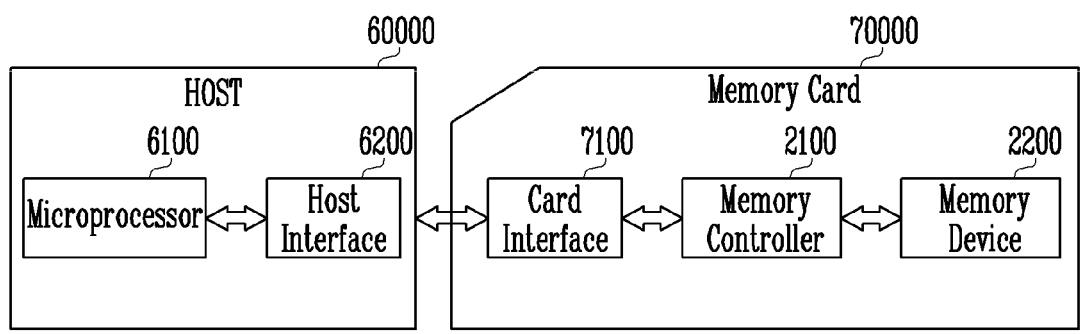
FIG. 22 is another example memory system including the memory controller shown in FIG. 14.

FIG. 22 is a diagram illustrating another example of the memory system including the memory controller shown in FIG. 14.

Referring to FIG. 22, the memory system 70000 may be implemented as a memory card or a smart card. The memory system 70000 may include a memory device 2200, a memory controller 2100, and a card interface 7100.

The memory controller 2100 may control data exchange between the memory device 2200 and the card interface 7100. In some embodiments, the card interface 7100 may be a Secure Digital (SD) card interface or a Multi-Media Card (MMC) interface, but the present disclosure is not limited thereto.

The card interface 7100 may interface data exchange between a host 60000 and the memory controller 2100 according to a protocol of the host 60000. In some embodiments, the card interface 7100 may support a Universal Serial Bus (USB) protocol and an Inter-Chip (IC)-USB protocol. The card interface 7100 may mean hardware capable of supporting a protocol used by the host 60000, software embedded in the hardware, or a signal transmission scheme.

When the memory system 70000 is connected to a host interface 6200 of the host 60000 such as a PC, a tablet PC, a digital camera, a digital audio player, a cellular phone, console video game hardware, or a digital set-top box, the host interface 6200 may perform data communication with the memory device 2200 through the card interface 7100 and the memory controller 2100 under the control of a microprocessor 6100.

In accordance with the present disclosure, an error floor problem can be mitigated.

What is claimed is:

1. An error correction decoder, comprising:
   a node processor configured to perform at least one iteration of an error correction decoding based on at least one parameter used for an iterative decoding;
   a reliability information generator configured to generate reliability information corresponding to a current iteration upon a determination that the error correction decoding corresponding to the current iteration has been unsuccessful; and
   a parameter adjuster configured to adjust the at least one parameter upon a determination that the reliability information satisfies a predetermined condition, and control the node processor to perform a next iteration based on the adjusted parameter, and
   wherein the parameter adjuster is configured to adjust the at least one parameter, upon a determination that a ratio of a number of satisfied check nodes (SCNs) corresponding to the current iteration to a total number of check nodes is less than a first threshold value.

2. The error correction decoder of claim 1, wherein the at least one parameter includes at least one of initial log likelihood ratio (LLR) values, a scaling factor, or a scaling offset.

3. The error correction decoder of claim 1, wherein the reliability information is associated with at least one of the number of satisfied check nodes (SCNs) corresponding to the current iteration, a posteriori probabilities(APPS) of variable nodes, or minimum values of check nodes.

4. The error correction decoder of claim 3, wherein the parameter adjuster is configured to adjust the at least one parameter, upon a determination that a ratio of a number of variable nodes of which an APP is equal to or greater than a first set value to a total number of variable nodes is less than a second threshold value.

5. The error correction decoder of claim 4, wherein the first set value is higher for a higher quantization level of initial LLR values than for a lower quantization level of initial LLR values.

6. The error correction decoder of claim 3, wherein the parameter adjuster is configured to adjust the at least one parameter, upon a determination that a ratio of a number of check nodes of which minimum value is equal to or greater than a second set value to a number of total check nodes is less than a third threshold value.

7. The error correction decoder of claim 6, wherein the second set value is set to be greater for a higher quantization level of initial LLR values compared to a lower quantization level of initial LLR values.

8. A memory system comprising:
   a memory device; and
   a memory controller in communication with the memory device and configured to receive at least one read vector from a first storage area of the memory device and perform an error correction decoding based on the received read vector,
   wherein the memory controller includes:
   a node processor configured to perform east one iteration of the error correction decoding based on at least one parameter used for an iterative decoding;
   a reliability information generator configured to generate reliability information corresponding to a current iteration upon a determination that the error correction decoding corresponding to the current iteration has been unsuccessful; and
   a parameter adjuster configured to adjust the at least one parameter upon a determination that the reliability information satisfies a predetermined condition, and control the node processor to perform a next iteration based on the adjusted parameter, and
   wherein the reliability information generator is configured to determine an iteration number in which generation of the reliability information is to be started based on a read number corresponding to the first storage area.

9. The memory system of claim 8, wherein the memory controller further includes a read number manager configured to receive information on the first storage area including the read number and manage the read number corresponding to the first storage area.

10. The memory system of claim 8, wherein the at least one parameter includes at least one of initial log likelihood ratio (UR) values, a scaling factor, or a scaling offset.

11. The memory system of claim 8, wherein the reliability information is associated with at least one of a number of satisfied check nodes (SCNs) corresponding to the current iteration, a posteriori probabilities (APPs) of variable nodes, or minimum values of check nodes.

12. The memory system of claim 11, wherein the parameter adjuster is configured to adjust the at least one parameter upon a determination that a ratio of a number of SCNs corresponding to the current iteration to a total number of check nodes is less than a first threshold value.

13. The memory system of claim 11, wherein the parameter adjuster is configured to adjust the at least one parameter upon a determination that a ratio of a number of variable nodes of which an APP is equal to or greater than a first set value to a total number of variable nodes is less than a second threshold value.

14. The memory system of claim 13, wherein the memory controller further includes a mapper configured to generate initial LLR values quantized into multiple quantization levels by using the at least one read vector,
   wherein the first set value is set to be greater for a higher quantization level.

15. The memory system of claim 11, wherein the parameter adjuster is configured to adjust the at least one parameter upon a determination that a ratio of a number of check nodes of which minimum value is equal to or greater than a second set value to a total number of check nodes is less than a third threshold value.

16. The memory system of claim 15, wherein the memory controller further includes a mapper configured to generate initial LLR values quantized into multiple quantization levels by using the at least one read vector,
   wherein the second set value is set to be greater for a higher quantization level of initial LLR values than for a lower quantization level of initial LLR values.

17. The memory system of claim 8, wherein the memory controller further includes:

an error correction encoder configured to receive an original data and generate a codeword by performing an error correction encoding on the original data;

a randomizer configured to generate a randomized codeword by randomizing the generated codeword; and a central processing unit configured to generate a command and an address and store the generated randomized codeword in the first storage area.

18. The memory system of claim 17, wherein the reliability information is associated with at least one of a number of satisfied check nodes (SCNs) corresponding to the current iteration, a posteriori probabilities (APPs) of variable nodes, minimum values of check nodes, or hard decision values of the variable nodes.

19. The memory system of claim 18, wherein the parameter adjuster is configured to adjust the at least one parameter upon a determination that a ratio of a number of variable nodes of which hard decision value is 1 to a total number of variable nodes is less than a fourth threshold value.

* * * * *